US010669157B2

United States Patent
Itabashi et al.

(10) Patent No.: US 10,669,157 B2
(45) Date of Patent: *Jun. 2, 2020

(54) ZEOLITE PRODUCTION METHOD

(71) Applicants: UNIZEO CO., LTD., Tokyo (JP); The University of Tokyo, Tokyo (JP)

(72) Inventors: Keiji Itabashi, Tokyo (JP); Tatsuya Okubo, Tokyo (JP); Yoshihiro Kamimura, Tokyo (JP); Shanmugam Palani Elangovan, Tokyo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 2 days.

This patent is subject to a terminal disclaimer.

(21) Appl. No.: 15/492,318

(22) Filed: Apr. 20, 2017

(65) Prior Publication Data

US 2017/0267535 A1  Sep. 21, 2017

Related U.S. Application Data

(63) Continuation of application No. 13/807,080, filed as application No. PCT/JP2011/064765 on Jun. 28, 2011, now Pat. No. 9,670,068.

(30) Foreign Application Priority Data

Jul. 1, 2010  (JP) .................. 2010-151489
Nov. 24, 2010  (JP) .................. 2010-260929
Jun. 24, 2011  (JP) .................. 2011-140636

(51) Int. Cl.
*C01B 39/02* (2006.01)
*C01B 39/36* (2006.01)
(Continued)

(52) U.S. Cl.
CPC .......... *C01B 39/46* (2013.01); *B01J 29/7007* (2013.01); *C01B 39/02* (2013.01); *C01B 39/026* (2013.01);
(Continued)

(58) Field of Classification Search
CPC ......... C01B 39/46; C01B 39/42; C01B 39/38; C01B 39/365; C01B 39/36; C01B 39/026
See application file for complete search history.

(56) References Cited

U.S. PATENT DOCUMENTS 3,308,069 A   3/1967  Wadlinger et al.
4,341,748 A   7/1982  Plank et al.
(Continued)

FOREIGN PATENT DOCUMENTS

CN  1145278 A  3/1997
CN  1504410 A  6/2004
(Continued)

OTHER PUBLICATIONS

Majano et al, "Al-Rich Zeolite Beta by Seeding in the Absence of Organic Template", Chem. Mater,(2009) pp. 4184-4191 (Year: 2009).*

(Continued)

*Primary Examiner* — David M Brunsman
(74) *Attorney, Agent, or Firm* — Locke Lord LLP; James E. Armstrong, IV; Nicholas J. DiCeglie, Jr.

(57) ABSTRACT

Disclosed is a method for readily and inexpensively producing zeolite without using an organic structure-directing agent (organic SDA). Specifically disclosed is a method whereby a gel containing a silica source, an alumina source, an alkaline source and water is reacted with zeolite seed crystals, to produce a zeolite with the same kind of skeletal structure as the zeolite. The gel used is a gel of a composition whereby, when a zeolite is synthesized from this gel (Continued)

only, the synthesized zeolite comprises at least one of the kinds of composite building units of the target zeolite.

15 Claims, 11 Drawing Sheets

(51) Int. Cl.
| | |
|---|---|
| *C01B 39/42* | (2006.01) |
| *C01B 39/46* | (2006.01) |
| *B01J 29/70* | (2006.01) |
| *C01B 39/26* | (2006.01) |
| *C01B 39/38* | (2006.01) |
| *C30B 5/00* | (2006.01) |
| *C30B 29/34* | (2006.01) |

(52) U.S. Cl.
CPC ............ *C01B 39/26* (2013.01); *C01B 39/36* (2013.01); *C01B 39/365* (2013.01); *C01B 39/38* (2013.01); *C01B 39/42* (2013.01); *C30B 5/00* (2013.01); *C30B 29/34* (2013.01)

(56) References Cited

U.S. PATENT DOCUMENTS

| | | | |
|---|---|---|---|
| 5,232,579 A | 8/1993 | Absil et al. | |
| 7,264,789 B1 | 9/2007 | Van Den Berge et al. | |
| 8,282,908 B2 * | 10/2012 | Itabashi | C01B 39/46 423/709 |
| 8,834,836 B2 * | 9/2014 | Itabashi | C01B 39/46 423/709 |
| 8,865,121 B2 | 10/2014 | Xiao et al. | |
| 9,238,219 B2 | 1/2016 | Kubota et al. | |
| 9,333,495 B2 * | 5/2016 | Itabashi | C01B 39/42 |
| 9,670,068 B2 * | 6/2017 | Itabashi | C01B 39/02 |
| 9,688,541 B2 * | 6/2017 | Itabashi | C01B 39/46 |
| 2003/0127359 A1 | 7/2003 | Takewaki et al. | |
| 2004/0067842 A1 | 4/2004 | Pinnavaia et al. | |
| 2008/0145310 A1 | 6/2008 | Breuninger | |
| 2008/0249346 A1 | 10/2008 | Galperin et al. | |
| 2008/0261803 A1 | 10/2008 | Luo et al. | |
| 2009/0197426 A1 | 8/2009 | Abrevaya et al. | |
| 2009/0318696 A1 | 12/2009 | Strohmaier et al. | |
| 2010/0322847 A1 | 12/2010 | Xiao et al. | |
| 2011/0039102 A1 | 2/2011 | Chaumonnot et al. | |
| 2011/0286914 A1 | 11/2011 | Li et al. | |
| 2012/0190534 A1 | 7/2012 | Itabashi et al. | |
| 2015/0086786 A1 | 3/2015 | Itabashi et al. | |
| 2017/0267536 A1 | 9/2017 | Itabashi et al. | |

FOREIGN PATENT DOCUMENTS

| | | |
|---|---|---|
| CN | 1872685 A | 12/2006 |
| CN | 1891627 A | 1/2007 |
| CN | 101205072 A | 6/2008 |
| CN | 101249968 A | 8/2008 |
| CN | 100425534 C | 10/2008 |
| EP | 0156595 A2 | 3/1985 |
| EP | 1892040 A1 | 2/2008 |
| EP | 2457872 A1 | 5/2012 |
| JP | 05-201722 A | 8/1993 |
| JP | 2002-519281 A | 7/2002 |
| JP | 2008-519748 A | 6/2008 |
| JP | 2010-537938 A | 12/2010 |
| JP | 2011-126768 A | 6/2011 |
| KR | 10-0624246 B1 | 9/2006 |
| KR | 2007-0086085 A | 8/2007 |
| WO | WO-00/06494 A1 | 2/2000 |
| WO | WO-2006/065591 A2 | 6/2006 |
| WO | 2010/145077 A1 | 12/2010 |
| WO | 2011/013560 A1 | 2/2011 |

OTHER PUBLICATIONS

Huang et al, "Controlling Crystal Transformation between Zeolite ZSM-5 and Mordenite without Organic Structure-Directing Agent", Chinese journal of Catalysis, vol. 33, iss 8, (2012) pp. 1290-1298 (Year: 2012).*
Gang Li et al, "The control of phase and orientation in zeolite membranes by the secondary growth method", Microporous and Mesoporous Materials 62 (2003) 211-220 (Year: 2003).*
Ueda et al, "Crystallization of mordenite from aqueous solutions", American Mineralogist, vol. 65, pp. 1012-1019, (I980) (Year: 1980).*
Iyoki et al, "Synthesis of MTW-type Zeolites in the Absence of Organic Structure-directing Agent", Chem. Lett (Jun. 5, 2010) pp. 730-731 (Year: 2010).*
Yoshihiro Kamimura et al., "Yuki Kozo Kiteizai o Mochiinai Zeolite beta Oyobi green beta no Gosei to sono Tokusei,"Dai 25 Kai Zeolite Kenkyu Happyokai Koen Yokoshu, Nov. 25, 2009, vol. 25th, p. 31.
Yoshihiro Kamimura et al., "Shukessho Tenka Yuki Kozo Kiteizai Mutenka ni yoru β-gata Zeolite no Gosei to sono Tokusei," Abstracts of 75th Annual Meeting of the Society of Chemical Engineers, Japan, Feb. 18, 2010, vol. 75th, p. ROMBUNNO. I205.
Bin Xie et al., "Organotemplate-Free and Fast Route for Synthesizing Beta Zeolite," Chemistry of Materials, vol. 20, No. 14, 2008, pp. 4533 to 4535.
International Search Report dated Aug. 30, 2011, issued for PCT/JP2011/064765.
Rinoka, "Synthesis and Properties of Hierarchical Mordenite Molecular Sieve" Full text data base of excellent theses for master degree in China, edited by process science and technology 1, Sep. 15, 2009, 4 sheets.
Zhao Pei-xia et al. "Study on Physical Chemistry of Modified Naβ Zeolite", Kanan Chemistry and Technology, vol. 25, First Term, Jan. 20, 2008, pp. 21-24.
Office Action dated Apr. 28, 2014, issued to CN Application No. 201180032111.5 and partial translation thereof.
Dongyuan Zhao et al., "Role of alkali-metal cations and seeds in the synthesis of silica-rich heulandite-type zeolites," J. Mater. Chem., 1998, 8(1), pp. 233-239.
Second Office Action issued to CN Application No. 201180032111. 5, dated Jan. 23, 2015.
Extended European Search Report issued in corresponding European Patent Application No. EP 11800831.7, dated Nov. 26, 2015.
Office Action issued for corresponding Korean Patent Application No. KR 10-2012-7033961, dated Mar. 21, 2017.
Extended European search report issued to EP Patent Application No. 13775736.5, dated Apr. 2, 2015.
International Search Report issued to International Application No. PCT/JP2013/060684 dated Jul. 9, 2013.
J. Phys. Chem., B 1999, 103, 2674-2679.
Jiang et al, "Extra large pore zeolites: bridging the cap between micro and mesoporous structures", Angwe. Chem. Int. Ed. (2010) pp. 3120-3145.
Notice of References Cited issued to U.S. Appl. No. 14/391,547, dated Mar. 1, 2017.
Office Action issued to CN Patent Application No. 201380018964.2, dated Jul. 27, 2015.
Office Action issued to CN Patent Application No. 201610292264.8, dated May 14, 2018.
Study on Synthesis and Synthesis Conditions of ZSM-5 by a Template Agent Free Method, Ye Jiang, et al., 15th National Molecular Sieve Science, Conference Paper Collection, pp. 357 and 358, Oct. 11, 2009.
Topics in Catalysis 9 (1999), 35-42.
Chem. Eur. J. 2002, 8, No. 22, 5153-5160.
Yoshihiro Kamimura et al., "Seed-Assisted, OSDA-Free Synthesis of Zeolites", Catalyst, Dec. 10, 2011 (Dec. 10, 2011), vol. 53, No. 7, pp. 386 to 391.

(56) References Cited

OTHER PUBLICATIONS

Office Action issued to U.S. Appl. No. 15/492,330, dated Jun. 22, 2018.
Office Action issued to U.S. Appl. No. 15/492,361, dated Jun. 22, 2018.
Office Action (Examination Report) issued in corresponding Indian Patent Application No. IN 7872/CHENP/2014, dated Jul. 30, 2018.

* cited by examiner

[Fig.1]
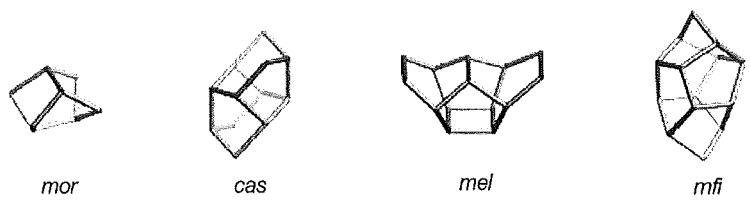
[Fig.2]
mor

[Fig. 3A]
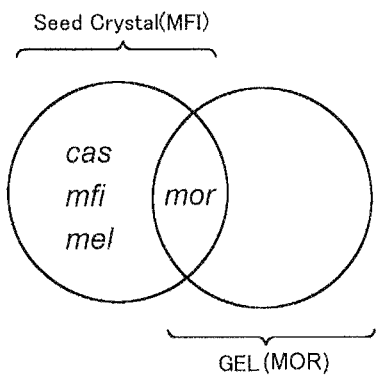
[Fig. 3B]
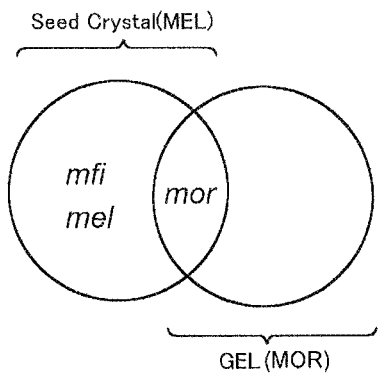
[Fig. 3C]
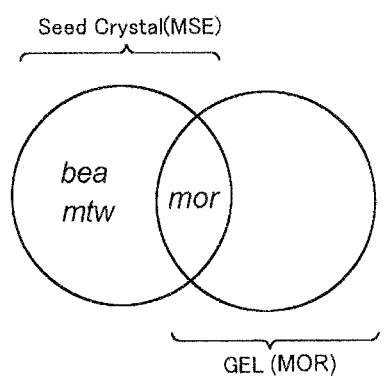
[Fig. 3D]
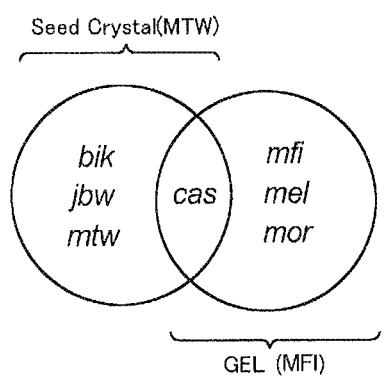
[Fig. 3E]
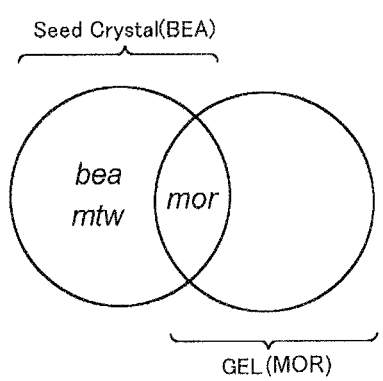

[Fig.4]
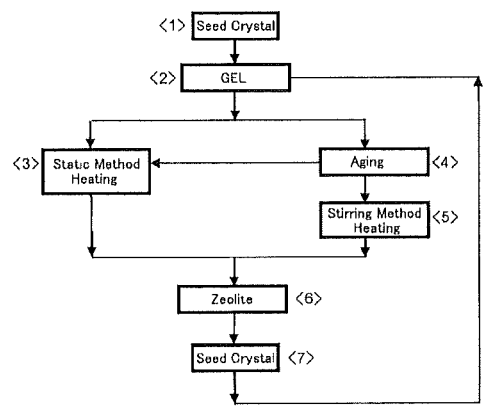
[Fig.5]
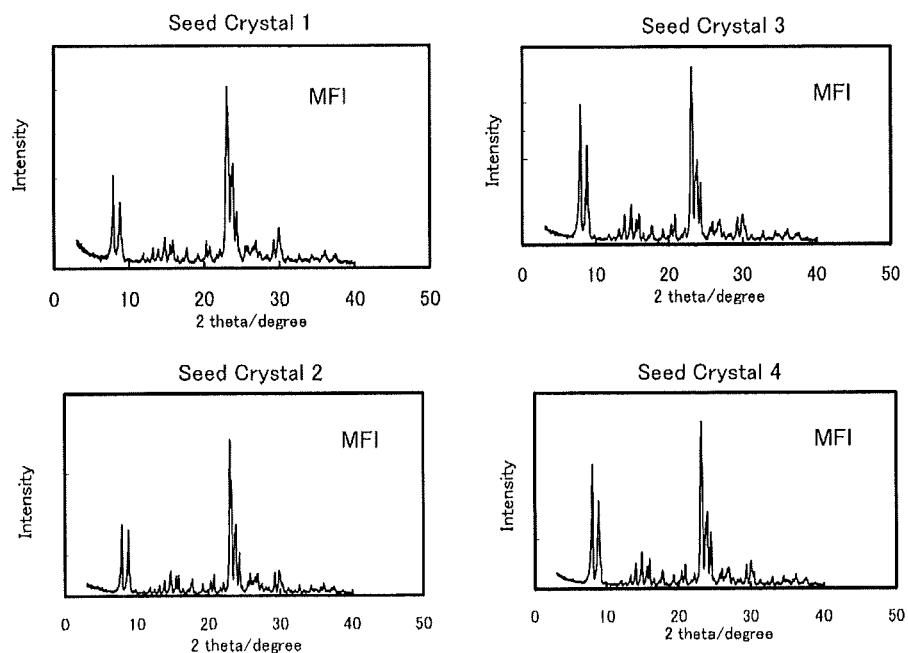

[Fig. 6A]
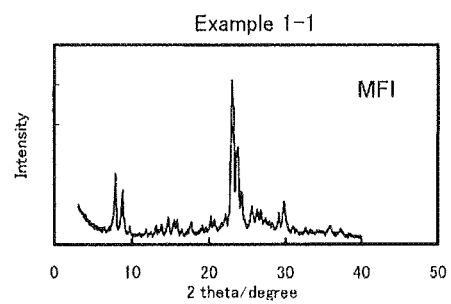
Example 1-1
[Fig. 6B]
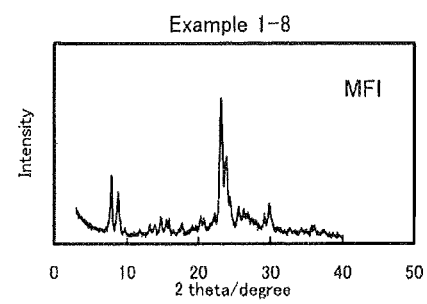
Example 1-8
[Fig.7]
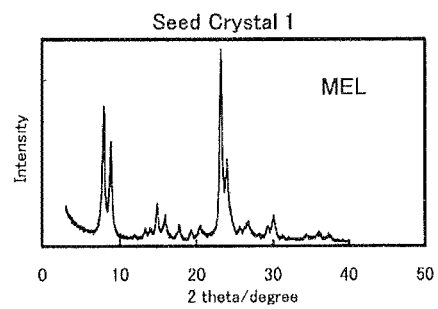
Seed Crystal 1
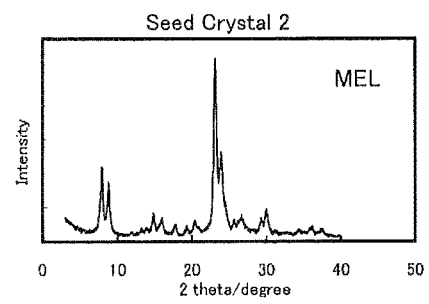
Seed Crystal 2

[Fig. 8A]
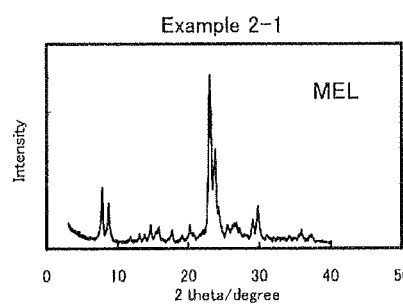
Example 2-1
[Fig. 8B]
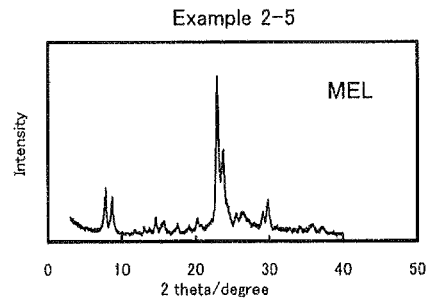
Example 2-5
[Fig. 8C]
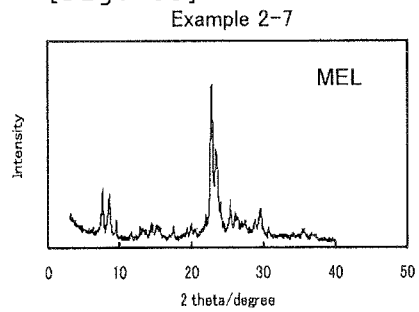
Example 2-7
[Fig. 9]
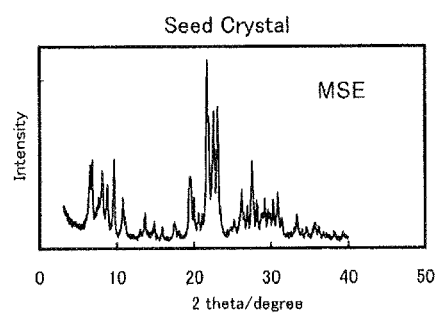
Seed Crystal

[Fig. 10A]
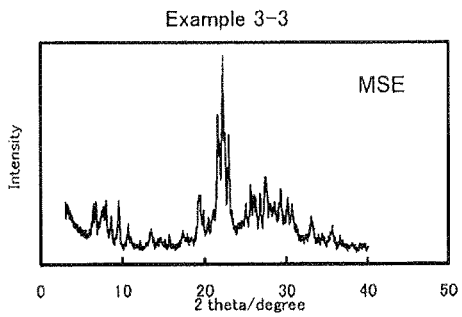
Example 3-3
[Fig. 10B]
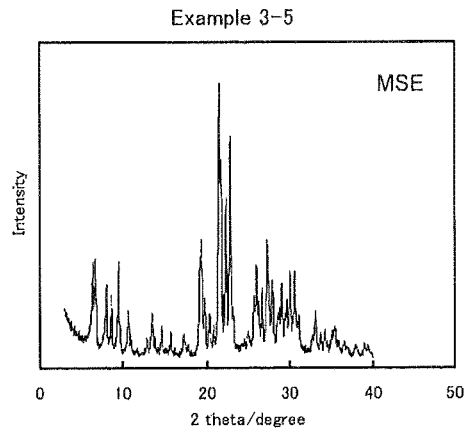
Example 3-5
[Fig. 10C]
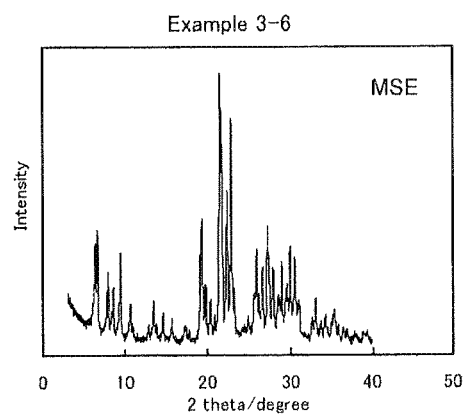
Example 3-6
[Fig. 11]
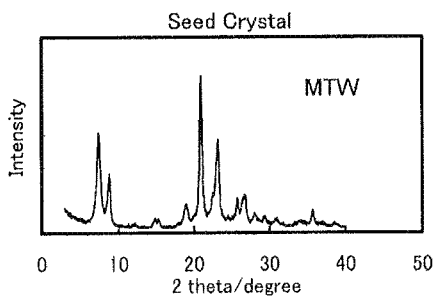
Seed Crystal

[Fig. 12A]
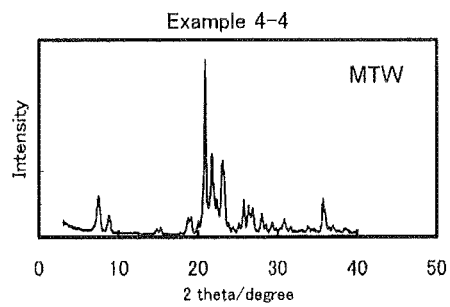
[Fig. 12B]
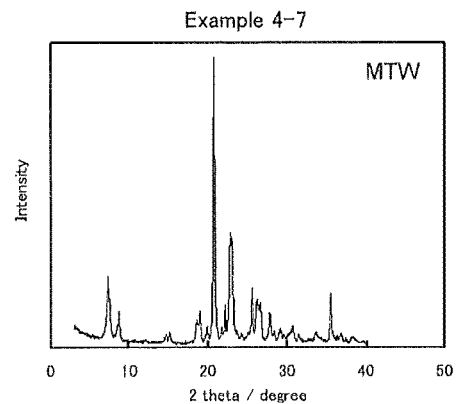
[Fig. 12C]
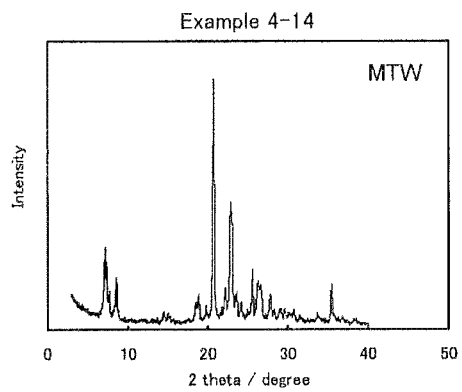
[Fig. 13]
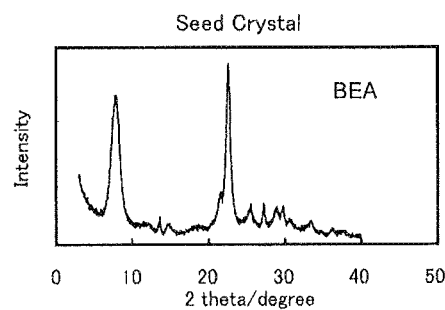

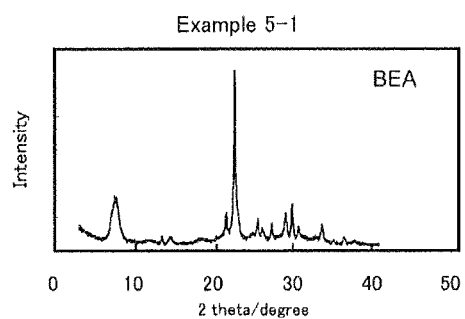
[Fig. 14A] Example 5-1
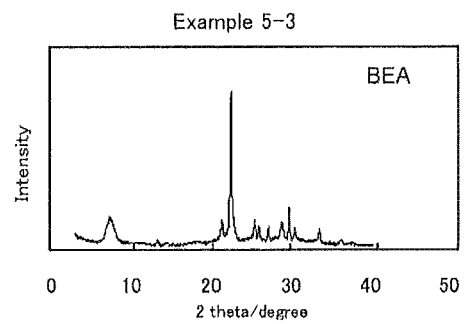
[Fig. 14B] Example 5-3
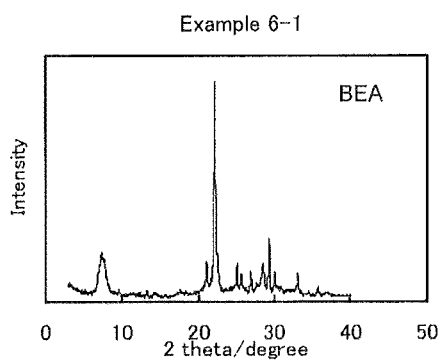
[Fig. 15A] Example 6-1
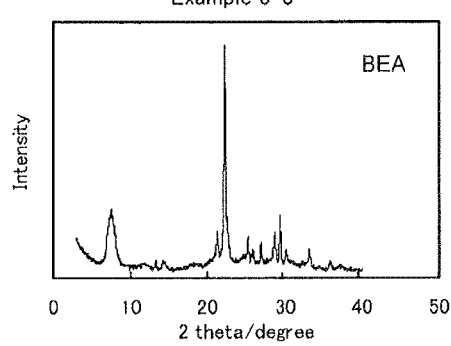
[Fig. 15B] Example 6-3
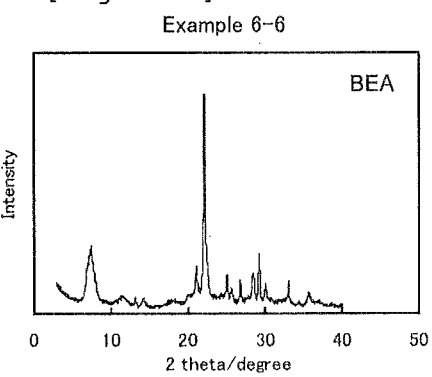
[Fig. 15C] Example 6-6

[Fig. 16A]
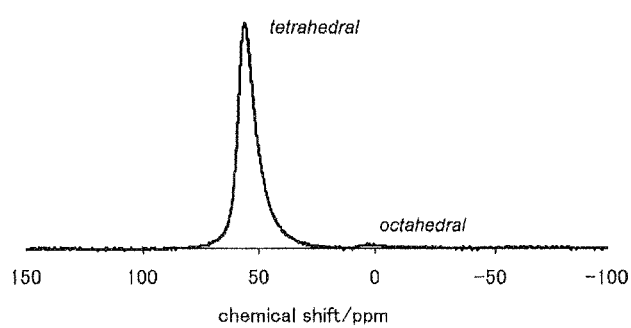
[Fig. 16B]
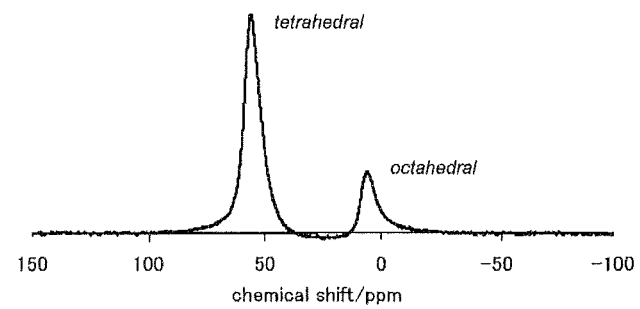

[Fig. 17A]
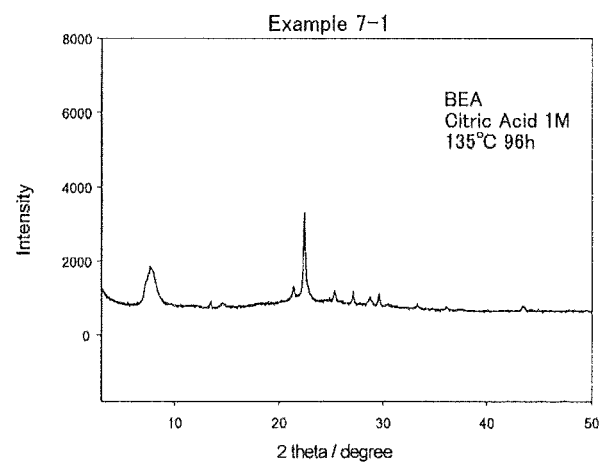
[Fig. 17B]
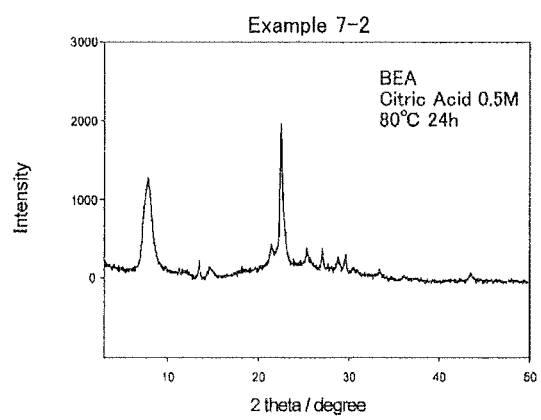
[Fig. 17C]
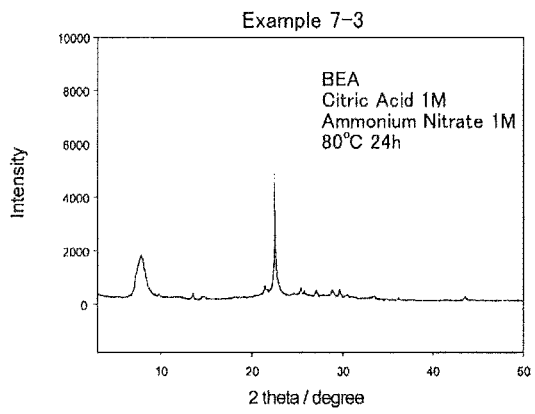

[Fig. 18A]
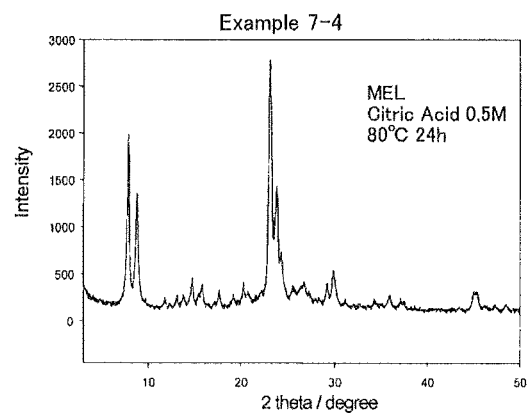
[Fig. 18B]
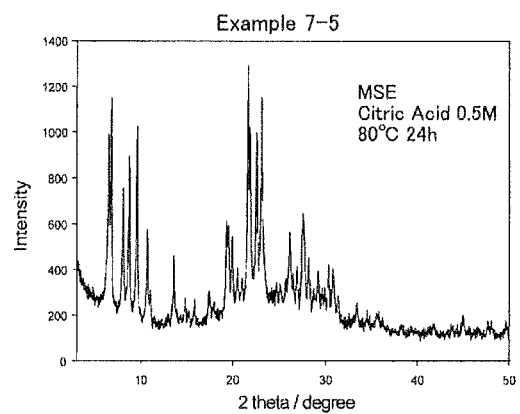
[Fig. 18C]
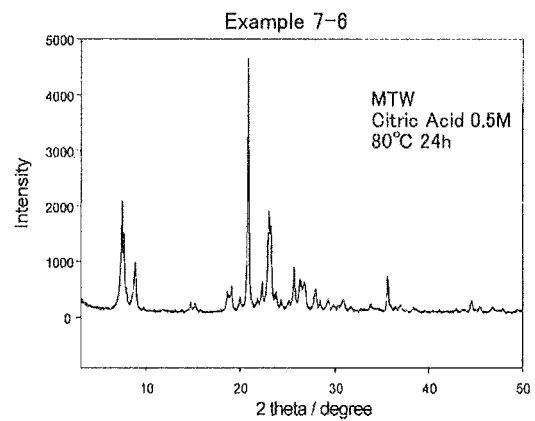

ZEOLITE PRODUCTION METHOD

CROSS REFERENCE TO RELATED APPLICATIONS

This application is a Continuation of U.S. patent application Ser. No. 13/807,808, filed Dec. 27, 2012, now U.S. Pat. No. 9,670,068, which application is the 35 U.S.C. § 371 National Phase Application of International PCT Patent Application No. PCT/JP2011/064765, filed Jun. 28, 2011, which application claims the benefit of priority to Japanese Patent Application No. JP 2011-140636, filed Jun. 24, 2011, Japanese Patent Application No. JP 2010-260929, filed Nov. 24, 2010, and Japanese Patent Application No. JP 2010-151489, filed Jul. 1, 2010, the contents of each of which in their entirety are hereby incorporated herein by reference.

TECHNICAL FIELD

The present invention relates to a zeolite production method in which zeolite seed crystals are used.

BACKGROUND ART

Synthetic zeolites are crystalline aluminosilicates, and have uniform fine pores of a size of angstroms which are produced due to the crystalline structure. Using this characteristic, synthetic zeolites are industrially used as a molecular sieve adsorbent which adsorbs only molecules having a specific size, an adsorption separating agent which adsorbs molecules having a strong affinity, or a basis of catalysts.

A variety of zeolite production methods have been proposed. When, for example, beta zeolite, which is one synthetic zeolite, is considered as an example, an ordinary zeolite production method is a method in which tetraethylammonium ions are used as an organic structure-directing agent (hereinafter referred to as an "organic SDA"). Such a method is described in, for example, the following PTL 1. However, while compounds including tetraethylammonium ions are expensive, the compounds are almost decomposed after crystallization of beta zeolite is completed, and therefore it is impossible to collect and reuse the compounds. As a result, beta zeolite produced using this method is expensive. Furthermore, since tetraethylammonium ions are entrapped in the crystals, it is necessary to fire and remove tetraethylammonium ions when beta zeolite is used as an adsorbent or a catalyst. At this time, exhaust gas causes environmental contamination, and a large amount of chemicals is also required for a detoxifying treatment of the mother fluid of synthesis. As such, since a method of synthesizing a zeolite in which the organic SDA is used is a production method which is not only expensive but also causes a large environmental load, there has been a demand for realization of a production method in which the organic SDA is not used.

Under such circumstances, in recent years, a method of synthesizing beta zeolite in which the organic SDA is not used has been proposed (refer to NPL 1). In this method, a substance obtained by firing beta zeolite, which has been synthesized using tetraethylammonium ions, so as to remove organic components is used as seed crystals, the substance is added to a sodium aluminosilicate reaction mixture which does not include any organic substance, and a hydrothermal treatment is carried out, thereby crystallizing beta zeolite. However, in this method, since beta zeolite, which has been synthesized using tetraethylammonium ions, is fired and used as seed crystals, tetraethylammonium ions become necessary at all times as the organic SDA while the amount of the organic SDA used decreases. In addition, according to this method, there is only one kind of seed crystal, and there is only one numerically limited example for the composition of the sodium aluminosilicate reaction mixture. Therefore, while the composition of the synthesized beta zeolite is not clearly described, the composition is considered to have only the determined values.

Meanwhile, PTL 2 by the authors of NPL 1 discloses the $SiO_2/Al_2O_3$ ratios of seed crystals, and also describes the composition of the sodium aluminosilicate reaction mixture not as a point composition but as a narrow range away from a point. However, since the contents disclosed by PTL 2 are basically the same technique as the contents of NPL 1, and the composition range of the reaction mixture is narrow, the $SiO_2/Al_2O_3$ ratio of beta zeolite is limited only to a limited range. In order to meet a variety of needs, zeolites having a wide $SiO_2/Al_2O_3$ ratio range are desirable. In addition, in order to reduce the environmental load as much as possible, there is a demand for proposing a new zeolite production method in which seed crystals which do not need to be fired are used, and the organic SDA is not used.

CITATION LIST

Patent Literature

[PTL 1] U.S. Pat. No. 3,308,069
[PTL 2] Chinese Patent Laid-Open Publication No. 101249968A

Non-Patent Literature

[NPL 1] Chemistry of Materials, Vol. 20, No. 14, pp. 4533 to 4535 (2008)

SUMMARY OF INVENTION

Technical Problem

Therefore, an object of the invention is to provide a zeolite production method which can solve the variety of problems of the related art.

Solution to Problem

As a result of thorough investigations in order to solve the problems, the inventors found that, when an organic SDA-free zeolite is produced by reacting zeolite seed crystals and a gel for zeolite synthesis, it is possible to readily obtain a target zeolite by introducing a concept of the composite building units of the zeolite for selecting the kind of the zeolite seed crystals and the composition of the gel.

The invention has been made based on the above finding, and solves the problems by providing a zeolite production method in which a gel including a silica source, an alumina source, an alkali source and water, and zeolite seed crystals are reacted so as to produce a zeolite having the same kind of skeletal structure as the zeolite, and, a gel having a composition which, when the zeolite is synthesized from the gel alone, makes the synthesized zeolite include at least one of the composite building units of the target zeolite as the composite building unit is used as the gel.

Advantageous Effects of Invention

According to the zeolite production method of the invention, it is possible to readily and inexpensively produce a target zeolite without using the organic SDA by appropriately selecting a kind of zeolite seed crystals and a composition of the gel based on the viewpoint of the composite building unit of the zeolite. Particularly, the method of the invention is effective for producing a zeolite which could not have been thus far produced without using the organic SDA.

BRIEF DESCRIPTION OF DRAWINGS

FIG. 1 is a view showing the composite building units of MFI zeolite.

FIG. 2 is a view showing the composite building unit of mordenite (MOR).

FIGS. 3A to 3E are views showing the relationship between the composite building units of zeolite seed crystals and the composite building units of zeolites produced from a gel alone.

FIG. 4 is a flow chart showing the sequence of the production method of the invention.

FIG. 5 shows X-ray diffraction diagrams of seed crystals used in Example 1-1 and the like.

FIGS. 6A and 6B are X-ray diffraction diagrams of zeolites obtained in Examples 1-1 and 1-8.

FIG. 7 shows X-ray diffraction diagrams of seed crystals used in Example 2-1 and the like.

FIGS. 8A to 8C are X-ray diffraction diagrams of zeolites obtained in Examples 2-1, 2-5, and 2-7.

FIG. 9 is an X-ray diffraction diagram of seed crystals used in Example 3-1 and the like.

FIGS. 10A to 10C are X-ray diffraction diagrams of zeolites obtained in Examples 3-3, 3-5, and 3-6.

FIG. 11 is an X-ray diffraction diagram of seed crystals used in Example 4-1 and the like.

FIGS. 12A to 12C are X-ray diffraction diagrams of zeolites obtained in Examples 4-4, 4-7, and 4-14.

FIG. 13 is an X-ray diffraction diagram of seed crystals used in Example 5-1 and the like.

FIGS. 14A and 14B are X-ray diffraction diagrams of zeolites obtained in Examples 5-1 and 5-3.

FIGS. 15A to 15C are X-ray diffraction diagrams of zeolites obtained in Examples 6-1, 6-3, and 6-6.

FIGS. 16A and 16B are $^{27}Al$ MAS NMR spectra of zeolites obtained in Examples 6-1 and 6-2.

FIGS. 17A to 17C are X-ray diffraction diagrams of beta zeolites obtained in Examples 7-1 to 7-3 after dealumination.

FIGS. 18A to 18C are X-ray diffraction diagrams of a variety of zeolites obtained in Examples 7-4 to 7-6 after dealumination.

DESCRIPTION OF EMBODIMENTS

In the zeolite production method of the invention, zeolite seed crystals and a gel for zeolite synthesis are used. In addition, a target zeolite is produced by mixing and reacting the seed crystals and the gel.

The zeolite seed crystals being used have the same kind of skeletal structure as the target zeolite. The "same kind of skeletal structure" means that, for example, in a case in which the seed crystals are beta zeolite, the target zeolite is also beta zeolite. In this case, the value of Si/Al and the like of the beta zeolite which is the seed crystals may be the same as or different from the value of Si/Al and the like of the target beta zeolite. The kind of the zeolite used as the seed crystals is not particularly limited, and a zeolite having the same kind of skeletal structure as the target zeolite can be appropriately used. Examples of the target zeolite include MFI, MEL, MSE, MTW, BEA, TUN, MFS, MOZ, EON, LTF, and the like when the target zeolite is expressed using structure codes consisting of three capital letters which are regulated by the International Zeolite Association, but the target zeolite is not limited thereto.

As a method of obtaining zeolite seed crystals, it is possible to employ a variety of methods which have thus far become known. For example, it is possible to employ (a) a zeolite production method without using an organic SDA. Alternatively, it is also possible to employ (b) a method of producing a zeolite using the organic SDA. In this case, a zeolite from which the organic SDA has been removed through firing is used. In addition, (c) it is also possible to produce a zeolite according to the invention using a zeolite produced using the organic SDA as seed crystals and use the produced zeolite as seed crystals. In a case in which the method (c) is employed, there is a large advantage that a zeolite which could not have been thus far produced without using the organic SDA can be produced without using the organic SDA.

The size of the zeolite seed crystals is not particularly limited. Generally, when seed crystals having an average grain diameter of 100 nm to 2000 nm and particularly 200 nm to 1000 nm are used, satisfactory results can be obtained. The average grain diameter refers to the grain diameter of the crystals having highest frequency in observation using a scanning electron microscope. However, the average grain diameter of the seed crystals does not limit the scope of the invention.

The $SiO_2/Al_2O_3$ ratio of the zeolite seed crystals is selected within an appropriate range depending on the kind of zeolite being used. In a case in which, for example, MFI is used as the zeolite seed crystals, the $SiO_2/Al_2O_3$ ratio is preferably 5 to 200, and particularly preferably 10 to 100. In a case in which MEL is used, similarly, the $SiO_2/Al_2O_3$ ratio is preferably 5 to 200, and particularly preferably 10 to 100. In a case in which MSE is used, the $SiO_2/Al_2O_3$ ratio is preferably 10 to 50, and particularly preferably 15 to 40. In a case in which MTW is used, the $SiO_2/Al_2O_3$ ratio is preferably 5 to 200, and particularly preferably 10 to 100. In a case in which BEA is used, the $SiO_2/Al_2O_3$ ratio is preferably 8 to 50, and particularly preferably 10 to 30. Meanwhile, the $SiO_2/Al_2O_3$ ratio of the zeolite seed crystals may be the same as or different from the $SiO_2/Al_2O_3$ ratio of the target zeolite depending on the producing conditions of the target zeolite.

The amount of the zeolite seed crystals being used is preferably less since the advantages of the invention further develop, and is appropriately determined in consideration of the production rate of the target zeolite and the like. Generally, the amount of the zeolite seed crystals is preferably 0.1 weight % to 30 weight %, particularly preferably 1 weight % to 20 weight %, and still more preferably 1 weight % to 10 weight % with respect to the silica component included in the gel.

The gel being used in the invention together with the zeolite seed crystals includes a silica source, an alumina source, an alkali source, and water. In addition, the gel has a composition from which a certain kind of zeolite is produced in a case in which the gel is heated alone.

Examples of the silica source include silica and a silicon-containing compound which can produce silicate ions in water. Specific examples thereof include wet-processed silica, dry-processed silica, colloidal silica, sodium silicate, aluminosilicate gels, and the like. The silica sources can be used as a single type or in combination of two or more kinds. Among the above silica sources, use of silica (silicon dioxide) is preferable since a zeolite can be obtained without producing unnecessary byproducts.

As the alumina source, for example, a water-soluble aluminum-containing compound can be used. Specific examples thereof include sodium aluminate, aluminum nitrate, aluminum sulfate, and the like. In addition, aluminum hydroxide is also one of the preferable alumina sources. The alumina sources can be used as a single type or in combination of two or more kinds. Among the above alumina sources, use of sodium aluminate or aluminum hydroxide is preferable since a zeolite can be obtained without producing unnecessary byproducts.

As the alkali source, for example, sodium hydroxide, potassium hydroxide, lithium hydroxide, or the like can be used. Meanwhile, in a case in which sodium silicate is used as the silica source or a case in which sodium aluminate is used as the alumina source, sodium, which is an alkali metal component included in the source, is also considered as NaOH which is an alkali component. Therefore, $Na_2O$, $K_2O$, and $Li_2O$ are computed as the sum of all alkali components in the reaction mixture.

The gel used in the invention contains the above respective components, and has a composition which, when a zeolite is synthesized from the gel alone, makes the synthesized zeolite include at least one of the composite building units of the target zeolite as the composite building unit. Before describing the composition of the gel in detail, the composite building units of a zeolite will be described.

For zeolites which have thus far become known, it is found that the skeletal structures are constituted by combinations of three-dimensional basic structures. The basic structures are termed composite building units, and, thus far, 47 kinds are known. In the International Zeolite Association, the respective composite building units are expressed using codes consisting of three small letters. For example, the skeletal structure of MFI zeolite is constituted by a combination of four composite building units shown in FIG. 1, that is, cas, mor, mel, and mfi. In addition, mordenite (MOR) includes only one composite building unit termed mor in the skeletal structure as shown in FIG. 2. The composite building units which constitute the skeletal structures of the respective zeolites are described in "Atlas of Zeolite Framework Types", 6th Revised Edition 2007, Structure Commission of the International Zeolite Association. The composite building units are geometrically classified basic structures which configure the skeletal structures of zeolites, and attention should be paid to the fact that a compound having a structure of the composite building unit does not exist.

In a case in which the target zeolite of the production method of the invention is MFI zeolite, there are four composite building units of cas, mor, mel, and mfi as described above, and the gel being used at this time has a composition which makes the zeolite synthesized from the gel include at least one composite building unit of cas, mor, mel, and mfi. As such a gel, for example, a gel having a composition from which mordenite (MOR), which is a zeolite including mor as the composite building unit, is produced may be used. The relationship is summarized and shown in FIG. 3.

As shown in FIG. 3A, in a case in which MFI zeolite is used as the seed crystals of the zeolite, when a gel having a composition from which mordenite (MOR), which is a zeolite including at least one of four composite building units of cas, mor, mel, and mfi which constitute the skeletal structure of MFI zeolite, is produced is used as the gel, MFI zeolite can be obtained as a target zeolite.

In addition, as shown in FIG. 3B, in a case in which MEL zeolite is used as the seed crystals of the zeolite, when a gel having a composition from which mordenite (MOR), which is a zeolite including at least one of three composite building units of mor, mel, and mfi which constitute the skeletal structure of MEL zeolite, is produced is used as the gel, MEL zeolite can be obtained as a target zeolite.

As shown in FIG. 3C, in a case in which MSE zeolite is used as the seed crystals of the zeolite, when a gel having a composition from which mordenite (MOR), which is a zeolite including at least one of three composite building units of bea, mtw, and mor which constitute the skeletal structure of MSE zeolite, is produced is used as the gel, MSE zeolite can be obtained as a target zeolite. Currently, MSE zeolite cannot be synthesized without using a special organic SDA such as N,N,N',N'-tetraethylbicyclo[2.2.2]-oct-7-ene-2,3:5,6-dipyrrolidinium diiodide.

As shown in FIG. 3D, in a case in which MTW zeolite is used as the seed crystals of the zeolite, when a gel having a composition from which MFI, which is a zeolite including at least one of four composite building units of bik, jbw, mtw, and cas which constitute the skeletal structure of MTW zeolite, is produced or a gel having a composition from which a plurality of compounds including MFI are produced is used as the gel, MTW zeolite can be obtained as a target zeolite.

Furthermore, as shown in FIG. 3E, in a case in which beta zeolite (BEA) is used as the seed crystals of the zeolite, when a gel having a composition from which mordenite (MOR), which is a zeolite including at least one of three composite building units of bea, mtw, and mor which constitute the skeletal structure of beta zeolite, is produced is used as the gel, beta zeolite can be obtained as a target zeolite. Meanwhile, beta zeolite shown in FIG. 3E has the same composite building unit as MSE zeolite shown in FIG. 3C, which has been described above, but has a different skeletal structure.

As the gel used in the invention, it is possible to use a gel having a composition which makes a zeolite synthesized from the gel alone have a different kind of skeletal structure from the zeolite of the seed crystals. The gels shown in FIGS. 3A to 3E, which have been thus far described, belong to the above case.

The proportions of a variety of components included in the gel used in the invention may be appropriately determined depending on, when a zeolite is synthesized from the gel alone, composite building units that the zeolite includes. Specifically, in the case shown in FIG. 3A, the silica source, the alumina source, the alkali source, and water may be mixed to be a gel being used so as to obtain a composition preferably expressed by the molar ratios shown in the following (a) or (b).

$SiO_2/Al_2O_3$=40 to 200, particularly 44 to 200

$Na_2O/SiO_2$=0.24 to 0.4, particularly 0.25 to 0.35

$H_2O/SiO_2$=10 to 50, particularly 15 to 25  (a)

$SiO_2/Al_2O_3$=10 to 40, particularly 12 to 40

$Na_2O/SiO_2$=0.05 to 0.25, particularly 0.1 to 0.25

$H_2O/SiO_2$=5 to 50, particularly 10 to 25  (b)

The method of producing a zeolite of the invention is particularly advantageous in producing a zeolite which could not have been produced without using the organic SDA in the past, and there are cases in which the method of producing a zeolite of the invention is still advantageous in producing a zeolite which can be obtained without using the organic SDA. For example, while MFI zeolite is a zeolite which can be synthesized without using the organic SDA, in this case, the lowest $SiO_2/Al_2O_3$ ratio that can be achieved is 24, and it is not possible to obtain MFI zeolite having a lower $SiO_2/Al_2O_3$ ratio than the above. In contrast to the above, when MFI zeolite is synthesized according to the production method of the invention, it is possible to obtain MFI zeolite having a lower $SiO_2/Al_2O_3$ ratio than 24 as shown in Examples 1-1 to 1-8 which will be described below.

In the case shown in FIG. 3B, the silica source, the alumina source, the alkali source, and water may be mixed in the gel being used so as to obtain a composition preferably expressed by the molar ratios shown in the following (a) or (b).

$SiO_2/Al_2O_3$=40 to 200, particularly 44 to 200

$Na_2O/SiO_2$=0.24 to 0.4, particularly 0.25 to 0.35

$H_2O/SiO_2$=10 to 50, particularly 15 to 25     (a)

$SiO_2/Al_2O_3$=10 to 40, particularly 12 to 40

$Na_2O/SiO_2$=0.05 to 0.25, particularly 0.1 to 0.25

$H_2O/SiO_2$=5 to 50, particularly 10 to 25     (b)

In the case shown in FIG. 3C, the silica source, the alumina source, the alkali source, and water may be mixed in the gel being used so as to obtain a composition preferably expressed by the molar ratios shown in the following (a) or (b). That is, a gel including only sodium ions may be used, and a gel including both sodium and potassium, that is, a gel including an ion mixture may be used. When a zeolite is synthesized using the gel including an ion mixture, compared to a case in which a zeolite is synthesized using the gel including only sodium ions, production of impurities as by-products, particularly, production of small amounts of zeolite by-products can be further prevented, which is advantageous. A zeolite can be synthesized from a gel including only potassium ions; however, when the fraction of potassium ions increases, there is a tendency for the crystallization rate to become slow, and the crystallinity of an obtained zeolite decreases. As the potassium source, for example, potassium hydroxide is preferably used. In addition, in order to adjust the $K_2O/(Na_2O+K_2O)$ ratio, a potassium salt such as potassium chloride, potassium sulfate, or potassium nitrate may be used as a potassium ion source other than potassium hydroxide.

$SiO_2/Al_2O_3$=40 to 200, particularly 44 to 200

$(Na_2O+K_2O)/SiO_2$=0.24 to 0.4, particularly 0.25 to 0.35

$K_2O/(Na_2O+K_2O)$=0 to 0.7, particularly 0.01 to 0.65

$H_2O/SiO_2$=10 to 50, particularly 15 to 25     (a)

$SiO_2/Al_2O_3$=10 to 40, particularly 12 to 40

$(Na_2O+K_2O)/SiO_2$=0.05 to 0.25, particularly 0.1 to 0.25

$K_2O/(Na_2O+K_2O)$=0 to 0.7, particularly 0.01 to 0.65

$H_2O/SiO_2$=5 to 50, particularly 10 to 25     (b)

In the case shown in FIG. 3D, the silica source, the alumina source, the alkali source, and water may be mixed in the gel being used so as to obtain a composition preferably expressed by the molar ratios shown below.

$SiO_2/Al_2O_3$=10 to 150, particularly 30 to 120

$Na_2O/SiO_2$=0.075 to 0.23, particularly 0.1 to 0.2

$H_2O/SiO_2$=5 to 50, particularly 8 to 20

In the case shown in FIG. 3E, the silica source, the alumina source, the alkali source, and water may be mixed in the gel being used so as to obtain a composition preferably expressed by the molar ratios shown in the following (a) or (b).

$SiO_2/Al_2O_3$=40 to 200, particularly 44 to 200

$Na_2O/SiO_2$=0.24 to 0.4, particularly 0.25 to 0.35

$H_2O/SiO_2$=10 to 50, particularly 15 to 25     (a)

$SiO_2/Al_2O_3$=10 to 40, particularly 12 to 40

$Na_2O/SiO_2$=0.05 to 0.25, particularly 0.1 to 0.25

$H_2O/SiO_2$=5 to 50, particularly 10 to 25     (b)

In the case shown in FIG. 3E, the inventors further found that, when lithium ions are added to the gel, (i) in a case in which the seed crystals are not added, mordenite is crystallized, and (ii) in a case in which beta zeolite is added as the seed crystals, beta zeolite can be obtained. As the lithium ion source, for example, a lithium halide such as lithium chloride or lithium bromide or a lithium salt such as lithium acetate may be used, and lithium hydroxide may be used. Lithium hydroxide is particularly preferably used as the lithium ion source. In a case in which beta zeolite is used as the seed crystals, the silica source, the alumina source, the alkali source, the lithium ion source, and water may be mixed in the gel being used so as to obtain a composition expressed by the molar ratios shown in the following (c).

$SiO_2/Al_2O_3$=6 to 40, particularly 10 to 40

$Na_2O/SiO_2$=0.05 to 0.25, particularly 0.1 to 0.25

$Li_2O/SiO_2$=0.005 to 0.25, particularly 0.01 to 0.15

$H_2O/SiO_2$=5 to 50, particularly 10 to 25     (c)

When a gel having the composition shown in the above (c) is used, compared to a case in which a gel having the composition shown in the above (a) and (b) is used, beta zeolite having a low $SiO_2/Al_2O_3$ ratio can be obtained, which is advantageous. In addition, as a result of investigations, the inventors unexpectedly clarified that, when a $^{27}Al$ MAS NMR spectrum is measured regarding beta zeolite obtained using a gel having the composition shown in the above (c), six-coordinate aluminum as well as tetracoordinate aluminum is present. Details of the existing state of the six-coordinate aluminum are not evident. As a result of measuring the BET surface area of beta zeolite obtained using a gel having the composition shown in the above (c) by a nitrogen adsorption measurement, it was found that the value becomes equal to or larger than the value of the BET surface area of beta zeolite obtained using a gel having the composition shown in the above (a) or (b).

In any case shown in FIGS. 3A to 3E, when a gel is prepared, the respective raw materials are preferably added sequentially using a method in which a uniform gel is readily obtained. For example, the alumina source is added to and dissolved in an aqueous solution of sodium hydroxide at room temperature, subsequently, the silica source is added, the mixture is stirred and mixed, whereby a uniform gel can be obtained. When preparing the gel, the temperature is not particularly limited and, generally, the gel is prepared at room temperature (20° C. to 25° C.)

The zeolite seed crystals and the gel can be mixed, for example, in a process of preparing the gel while the seed crystals are added to the silica source. Alternatively, in the process of preparing the gel, the seed crystals can be added to the gel before and after addition of the silica source. In addition, a method of adding the seed crystals after the gel is aged or temporarily heated is effective from the viewpoint of shortening the crystallization time (for example, refer to Example 5-10 described below). In any cases, after the mixing, the seed crystals and the gel are stirred and mixed so that the seed crystals are uniformly dispersed.

FIG. 4 shows an example of the sequence of producing a zeolite using a reaction between the zeolite seed crystals and the gel. In the invention, it is possible to produce a zeolite in an order of <1>, <2>, <3>, and <6> in FIG. 4. When this order is employed, it is possible to produce a zeolite having a wide range of $SiO_2/Al_2O_3$ ratio. In addition, it is also possible to produce a zeolite in an order of <1>, <2>, <4>, <3>, and <6> in FIG. 4. When this order is employed, there are frequent cases in which the seed crystals having a low $SiO_2/Al_2O_3$ ratio can be effectively used through static heating after aging.

Furthermore, in FIG. 4, it is also possible to produce a zeolite in an order of <1>, <2>, <4>, <5>, and <6>. In this order, operations of aging and stirring are carried out. The operations of aging and stirring are a new method necessary for mass production of a zeolite. The reason is that, since a large-scale pressurized vessel is required for mass production, a stirring operation is essential in order to maintain the internal temperature of the pressurized vessel constant. However, when stirring is carried out without the aging operation, there is an accompanying production of impurities such that the purity is liable to decrease.

In the production method of the invention, the following three orders are also available.

<7>, <2>, <3>, <6>
<7>, <2>, <4>, <3>, <6>
<7>, <2>, <4>, <5>, <6>

In the above three methods, a zeolite obtained using the method of the invention is used as the seed crystals. That is, in the three production methods, since the seed crystals can be repeatedly used, essentially, the organic SDA is not used. In summary, it is possible to term the above three methods a method of producing a zeolite using green processes which cause ultimately small environmental loads. Using the above production methods, a "green zeolite" is produced for the first time.

In the above respective orders, the gel including the seed crystals is fed into a sealed vessel, heated, and reacted so as to crystallize a target zeolite. The gel does not include the organic SDA.

In a case in which a seed crystals having a low $SiO_2/Al_2O_3$ ratio are used, heating the aged gel without stirring facilitates a progress of crystallization (an order of <1>, <2>, <4>, <3> and <6>). Aging refers to an operation in which the gel is held at a temperature lower than the reaction temperature for a certain period of time. Generally, the gel is left static without being stirred during aging. It is reported that aging brings about effects of preventing production of impurities as by-products, enabling heating during stirring without causing production of impurities as by-products, increasing the reaction rate, and the like. However, the action mechanism is not evident. The temperature and time of aging are set so as to develop the above effects as much as possible. In the invention, aging is carried out at preferably 20° C. to 80° C., more preferably 20° C. to 60° C., for preferably a range of two hours to one day.

In a case in which the gel is stirred in order to obtain a uniform temperature throughout the gel during heating, it is possible to prevent production of impurities as by-products by carrying out heating and stirring after aging (in an order of <1>, <2>, <4>, <5> and <6>). Stirring is carried out in order to make the composition and temperature of the gel uniform, and the gel is mixed by using stirring blades, rotating a vessel, or the like. The stirring intensity or number of revolutions may be adjusted depending on the uniformity of the temperature or the circumstance of production of impurities as by-products. Stirring may be carried out intermittently as well as continuously. A combination of aging and stirring in the above manner enables industrial mass production.

Three methods described below are methods of producing a zeolite using the green process which is one of the characteristics of the invention. According to the three methods, limitless self-reproduction becomes possible using a zeolite obtained according to the invention as the seed crystals, and a producing process in which the organic SDA is not used becomes possible. That is, the three methods are a method in an order of <7>, <2>, <3> and <6>, a method in an order of <7>, <2>, <4>, <3> and <6>, and a method in an order of <7>, <2>, <4>, <5> and <6>. The characteristics of the respective processes are as described above. In a case in which a zeolite obtained according to the invention is used as the seed crystals, regardless of the low $SiO_2/Al_2O_3$ ratio, there are frequent cases in which a zeolite can be crystallized without the aging operation in the case of static synthesis. In a case in which a zeolite synthesized using the organic SDA is used as the seed crystals, the fired zeolite is used; however, in a case in which a zeolite obtained using the invention is used, the zeolite does not need to be fired. This difference is assumed to result from the difference in the effects of the seed crystals, but the details are not evident. However, in a case in which the gel is stirred and heated, the gel is preferably aged.

In any case of the static method and the stirring method, the heating temperature is in a range of 100° C. to 200° C., and preferably 120° C. to 180° C., and the gel is heated under an autogenous pressure. At a temperature of lower than 100° C., since the crystallization temperature becomes extremely slow, there are cases in which the production efficiency of a zeolite becomes poor. On the other hand, at a temperature of higher than 200° C., since an autoclave having a high pressure capacity becomes necessary, the economic efficiency becomes poor, and the production rate of impurities becomes fast. The heating time is not critical in the present production method, and the gel may be heated until a zeolite having a sufficiently high crystallinity is produced. Generally, a zeolite having a satisfactory crystallinity can be obtained by approximately five hours to 240 hours of heating.

In the method of producing a zeolite of the invention, in a case in which the heating time is insufficient, an amorphous component is produced. In addition, when heating further continues after crystallization of a target zeolite is completed, production and growth of a zeolite which is produced when the zeolite is synthesized from the gel alone begins, and the proportion of the target zeolite decreases. A time during which only the target zeolite stably exists as a single phase varies depending on the temperature; however, generally, is not long. In order to obtain the target zeolite as a single phase, heating is made to be completed before the production and growth of a zeolite produced when the zeolite is synthesized from the gel alone begins so that the sealed vessel is cooled, and the reaction is completed. An accompaniment of an extremely small amount of impurity zeolite does not significantly impair the characteristics of the target zeolite, and the zeolite can be sufficiently used.

Crystals of the target zeolite can be obtained by heating. After completion of the heating, produced crystal powder is separated from the mother fluid through filtering, then, is washed using water or warm water, and is dried. The crystals of the obtained zeolite do not include organic substances in a dried state, and therefore the crystals do not need to be fired, and can be used as an adsorbent or the like when dehydrated. In addition, when used as a solid acid catalyst, the crystals can be used as an $H^+$ type by, for example, exchanging $Na^+$ ions in the crystals with $NH_4^+$ ions, and firing the crystals.

Once the target zeolite is obtained in the above manner, a post treatment may be carried out on the zeolite. Examples of the post treatment include dealumination using citric acid or a salt thereof. The Si/Al ratio in a zeolite can be further increased by carrying out dealumination. A zeolite becomes more versatile when the Si/Al ratio is increased.

The dealumination can be directly carried out on a Na-type, K-type, Li-type, or mixed-type zeolite. In addition, the dealumination can be carried out by mixing a zeolite which is a treatment target and an aqueous solution of citric acid, or heating a liquid mixture under the autogenous pressure. The concentration of the citric acid or the salt thereof in the liquid mixture is preferably set to 0.1 mol/L to 2 mol/L, and particularly preferably set to 0.5 mol/L to 1 mol/L. The concentration of the zeolite in the liquid mixture is preferably set to 10 g/L to 40 g/L, and particularly preferably set to 15 g/L to 25 g/L. The temperature of the liquid mixture is preferably set to 25° C. to 135° C., and particularly preferably set to 72° C. to 90° C. The heating time of the liquid mixture is preferably set to six hours to seven days, and particularly preferably set to 15 hours to 30 hours. In a case in which the liquid mixture is heated, in general, the liquid mixture is preferably heated while being stirred using an autoclave.

In the liquid mixture, an ammonium salt such as ammonium nitrate or ammonium chloride may coexist. Due to this, it is possible to effectively prevent a zeolite from becoming amorphous, which may be caused due to the dealumination, and to stabilize the crystallinity of the zeolite. The concentration of the ammonium nitrate is preferably set to 0.5 mol/L to 2 mol/L, and particularly preferably set to 0.8 mol/L to 1.2 mol/L from the viewpoint of making the above effect more significant.

After the dealumination, the zeolite is preferably washed using water, fired in the atmosphere, and converted into an H-type. Firing is preferably carried out at 400° C. to 550° C., and particularly preferably at 400° C. to 500° C. The firing time at this time is preferably three hours to six hours, and particularly preferably three hours to five hours.

Through the dealumination, the Si/Al ratio in the zeolite can be preferably increased to 5 to 50, and more preferably to 10 to 40. The dealumination smoothly progresses in a case in which beta zeolite is used as the zeolite.

For the dealumination of a zeolite using citric acid or a salt thereof, the above operation may be carried out once or may be repeated a plurality of times. When the dealumination is carried out a plurality of times, it is possible to preferably increase the upper limit value of the $SiO_2/Al_2O_3$ ratio of the zeolite to 400.

EXAMPLES

Hereinafter, the invention will be described in more detail using examples. However, the scope of the invention is not limited to the examples. Unless otherwise described, "%" represents "weight %". Meanwhile, analysis devices used in the following examples, comparative examples, and reference examples are as follows.

Powder X-ray diffraction apparatus: powder X-ray diffraction apparatus MO3XHF[22] produced by MAC Science Co., Ltd., Cuκα-ray used, voltage of 40 kV, current of 30 mA, scanning step of 0.02°, scanning speed 2°/min•Composition analyzing apparatus: ICP-AES LIBERTY Series II•BET surface area measuring apparatus produced by Varian Inc.: AUTOSORB-1 produced by Quantachrome Instruments Example 1-1

Synthesis of MFI Zeolite (1) Preparation of Seed Crystals

The following seed crystals 1 to 4 were prepared. The X-ray diffraction diagrams of the seed crystals are shown in FIG. 5.

Seed crystals 1 ($SiO_2/Al_2O_3$=24.0): HSZ-820NAA produced by Tosoh Corporation was used. This zeolite is MFI zeolite produced without using an organic structure-directing agent. This zeolite was used as seed crystals without being fired. BET specific surface area: 316 $m^2$/g.

Seed crystals 2 ($SiO_2/Al_2O_3$=40.0): This zeolite is MFI zeolite obtained by using sodium aluminate as the alumina source, powder-form silica (Cab-O-Sil, M-5) as the silica source, and sodium hydroxide as the alkali source, and carrying out stirring and heating using a well-known method of the related art in which an organic structure-directing agent is not used. The conditions of the stirring and heating are 170° C. and 96 hours. The $SiO_2/Al_2O_3$ ratio of the zeolite was 40.0. This zeolite was used as seed crystals without being fired. BET specific surface area: 295 $m^2$/g.

Seed crystals 3 and 4: These zeolites are MFI zeolites obtained by carrying out stirring and heating using a well-known method of the related art in which tetrapropylammonium hydroxide is used as an organic structure-directing agent, sodium aluminate is used as the alumina source, and powder-form silica (Cab-O-Sil, M-5) is used as the silica source. The conditions of the stirring and heating are 150° C. and 72 hours. The $SiO_2/Al_2O_3$ ratios of the zeolites were 52.0 (Seed crystals 3) and 60.8 (Seed crystals 4). The zeolites were fired at 550° C. for 10 hours in the air, and used as seed crystals.

(2) Synthesis of Zeolites

An aqueous solution was obtained by dissolving 0.115 g of sodium aluminate and 2.582 g of 36% sodium hydroxide in 12.88 g of pure water. A mixture of 2.427 g of powder-form silica (Cab-O-Sil, M-5) and 0.243 g of Seed crystals 1 was added to the aqueous solution little by little, stirred, and mixed so as to obtain a gel having a composition described in Table 1. When a zeolite is synthesized from the gel alone, the gel has a composition from which mordenite (MOR) is produced. A mixture of the gel and a mixture of the seed crystals was fed into a 60 cc stainless steel sealed vessel, and statically heated at 160° C. for 20 hours under the autogenous pressure without being aged and stirred. After cooling of the sealed vessel, a product was filtered and washed using warm water, thereby obtaining white powder. The X-ray diffraction diagram is shown in FIG. 6A. As is evident from the drawing, the product was MFI zeolite not including impurities. As a result of a composition analysis, the $SiO_2/Al_2O_3$ ratio and the BET specific surface area were as shown in Table 1.

Examples 1-2 to 1-10 and Comparative Examples 1-1 to 1-4

Zeolites were synthesized in the same manner as in Example 1-1 except that gels and seed crystals having compositions shown in Tables 1 and 2 were used, and the reaction conditions described in the tables were used. The results are shown in Tables 1 and 2. In addition, the X-ray diffraction diagram of the product obtained in Example 1-8 is shown in FIG. 6B. Meanwhile, when the zeolite is synthesized from the gel alone, all of the gels used in the examples and comparative examples had compositions from which mordenite (MOR) was produced.

known method of the related art in which tetrabutylammonium hydroxide is used as an organic structure-directing agent, sodium aluminate is used as the alumina source, and powder-form silica (Cab-O-Sil, M-5) is used as the silica source. The conditions of the stirring and heating are 180° C. and 96 hours. The $SiO_2/Al_2O_3$ ratios of the zeolites were 66.0 (Seed crystals 1) and 34.0 (Seed crystals 2). The zeolites were fired at 550° C. for 10 hours in the air, and used as seed crystals. The BET specific surface areas were 426 $m^2/g$ for Seed crystals 1 and 416 $m^2/g$ for Seed crystals 2.

(2) Synthesis of Zeolites

An aqueous solution was obtained by dissolving 0.113 g of sodium aluminate and 2.582 g of 36% sodium hydroxide in 12.88 g of pure water. A mixture of 2.427 g of powder-form silica (Cab-O-Sil, M-5) and 0.243 g of Seed crystals 1 was added to the aqueous solution little by little, stirred, and mixed so as to obtain a gel having a composition described in Table 3. When a zeolite is synthesized from the gel alone,

TABLE 1

| | Gel composition | | | Seed crystals | | Reaction conditions | | Products | | |
| | | | | | Addition | | | | | BET specific |
| Example | $SiO_2/Al_2O_3$ | $Na_2O/SiO_2$ | $H_2O/SiO_2$ | $SiO_2/Al_2O_3$ | amount*1 (wt %) | Temperature (° C.) | Time (h) | Zeolite | $SiO_2/Al_2O_3$ | surface area ($m^2/g$) |
|---|---|---|---|---|---|---|---|---|---|---|
| 1-1 | 100 | 0.300 | 20 | 24.0 | 10 | 160 | 20 | MFI | 18.6 | 307 |
| 1-2 | 100 | 0.300 | 20 | 40.0 | 20 | 150 | 16 | MFI | 23.8 | 254 |
| 1-3 | 100 | 0.300 | 20 | 24.0 | 20 | 150 | 24 | MFI | 21.0 | 321 |
| 1-4 | 100 | 0.300 | 20 | 52.0 | 20 | 150 | 30 | MFI | 23.0 | — |
| 1-5 | 100 | 0.300 | 20 | 60.8 | 20 | 150 | 30 | MFI | 22.2 | — |
| 1-6 | 70 | 0.300 | 25 | 24.0 | 30 | 160 | 21 | MFI | 19.2 | 317 |
| 1-7 | 80 | 0.275 | 20 | 24.0 | 20 | 160 | 22 | MFI | 19.4 | — |
| 1-8 | 70 | 0.325 | 25 | 24.0 | 30 | 165 | 11 | MFI | 17.0 | 397 |
| 1-9 | 40 | 0.300 | 25 | 24.0 | 20 | 160 | 24 | MFI (slightly low crystallinity) | — | — |
| 1-10 | 30 | 0.193 | 20 | 60.8 | 10 | 150 | 67 | MFI (slightly low crystallinity) | — | — |

*1 Amount of silica in the gel

TABLE 2

| | Gel composition | | | Seed crystals | | Reaction conditions | | |
| | | | | | Addition | | | |
| Comparative Example | $SiO_2/Al_2O_3$ | $Na_2O/SiO_2$ | $H_2O/SiO_2$ | $SiO_2/Al_2O_3$ | amount*1 (wt %) | Temperature (° C.) | Time (h) | Products |
|---|---|---|---|---|---|---|---|---|
| 1-1 | 100 | 0.300 | 20 | — | 0 | 160 | 50 | Amorphous + small amount of MOR |
| 1-2 | 100 | 0.300 | 20 | — | 0 | 140 | 288 | MOR |
| 1-3 | 40 | 0.300 | 25 | — | 0 | 140 | 144 | Amorphous + MOR |
| 1-4 | 30 | 0.193 | 20 | — | 0 | 150 | 240 | MOR |

*1 Amount of silica in the gel

Example 2-1

Synthesis of MEL Zeolite (1) Preparation of Seed Crystals

The following seed crystals 1 and 2 were prepared. The X-ray diffraction diagrams of the seed crystals are shown in FIG. 7.

Seed crystals 1 and 2: These zeolites are MEL zeolite obtained by carrying out stirring and heating using a wellthe gel has a composition from which mordenite (MOR) is produced. A mixture of the gel and a mixture of the seed crystals was fed into a 60 cc stainless steel sealed vessel, and statically heated at 140° C. for 15 hours under the autogenous pressure without being aged and stirred. After cooling of the sealed vessel, a product was filtered and washed using warm water, thereby obtaining white powder. The X-ray diffraction diagram is shown in FIG. 8A. As is clear from the drawing, the product was MEL zeolite not including impurities. As a result of a composition analysis, the $SiO_2/Al_2O_3$ ratio and the BET specific surface area were as shown in Table 3.

Examples 2-2 to 2-7 and Comparative Examples 2-1 to 2-4

Zeolites were synthesized in the same manner as in Example 2-1 except that gels and seed crystals having compositions shown in Tables 3 and 4 were used, and the reaction conditions described in the tables were used. The results are shown in Tables 3 and 4. In addition, the X-ray diffraction diagrams of the products obtained in Examples 2-5 and 2-7 are shown in FIGS. 8B and 8C. Meanwhile, when the zeolite is synthesized from the gel alone, all of the gels used in the examples and comparative examples had compositions from which mordenite (MOR) was produced.

(2) Synthesis of Zeolites

An aqueous solution was obtained by dissolving 0.096 g of sodium aluminate and 2.147 g of 36% sodium hydroxide in 10.74 g of pure water. A mixture of 2.022 g of powder-form silica (Cab-O-Sil, M-5) and 0.202 g of the seed crystals was added to the aqueous solution little by little, stirred, and mixed so as to obtain a gel having a composition described in Table 5. When a zeolite is synthesized from the gel alone, the gel has a composition from which mordenite (MOR) is produced. A mixture of the gel and a mixture of the seed crystals was fed into a 60 cc stainless steel sealed vessel, and statically heated at 160° C. for 29 hours under the autogenous pressure without being aged and stirred. After cooling of the sealed, vessel, a product was filtered and washed using warm water, thereby obtaining white powder.

TABLE 3

| | Gel composition | | | Seed crystals | | Reaction conditions | | Products | | |
| --- | --- | --- | --- | --- | --- | --- | --- | --- | --- | --- |
| | | | | | Addition | | | | | BET specific |
| Example | $SiO_2/$ $Al_2O_3$ | $Na_2O/$ $SiO_2$ | $H_2O/$ $SiO_2$ | $SiO_2/$ $Al_2O_3$ | amount*[1] (wt %) | Temperature (° C.) | Time (h) | Zeolite | $SiO_2/$ $Al_2O_3$ | surface area ($m^2/g$) |
| 2-1 | 100 | 0.300 | 20 | 66.0 | 10 | 140 | 15 | MEL | 17.6 | 326 |
| 2-2 | 100 | 0.300 | 20 | 34.0 | 20 | 150 | 20 | MEL | 18.8 | 315 |
| 2-3 | 70 | 0.300 | 20 | 34.0 | 30 | 160 | 20 | MEL | 19.0 | 319 |
| 2-4 | 70 | 0.325 | 25 | 34.0 | 30 | 160 | 13 | MEL | 18.4 | — |
| 2-5 | 60 | 0.325 | 25 | 34.0 | 30 | 160 | 15 | MEL | 17.4 | 438 |
| 2-6 | 50 | 0.325 | 25 | 34.0 | 30 | 160 | 17 | MEL | 16.2 | — |
| 2-7 | 30 | 0.193 | 20 | 66.0 | 10 | 150 | 67 | MEL | 15.4 | 317 |

*[1]Amount of silica in the gel

TABLE 4

| | Gel composition | | | Seed crystals | | Reaction conditions | | |
| --- | --- | --- | --- | --- | --- | --- | --- | --- |
| | | | | | Addition | | | |
| Comparative Example | $SiO_2/$ $Al_2O_3$ | $Na_2O/$ $SiO_2$ | $H_2O/$ $SiO_2$ | $SiO_2/$ $Al_2O_3$ | amount*[1] (wt %) | Temperature (° C.) | Time (h) | Products |
| 2-1 | 100 | 0.300 | 20 | — | 0 | 160 | 50 | Amorphous + small amount of MOR |
| 2-2 | 100 | 0.300 | 20 | — | 0 | 140 | 288 | MOR |
| 2-3 | 40 | 0.300 | 25 | — | 0 | 140 | 144 | Amorphous + MOR |
| 2-4 | 30 | 0.193 | 20 | — | 0 | 150 | 240 | MOR |

*[1]Amount of silica in the gel

Example 3-1

Synthesis of MSE Zeolite (1) Preparation of Seed Crystals

The following seed crystals were prepared. The X-ray diffraction diagram of the seed crystals is shown in FIG. 9.

N,N,N',N'-tetraethylbicyclo[2.2.2]-oct-7-ene-2,3:5,6-dipyrrolidinium diiodide was used as an organic structure-directing agent. According to the description in the specification of U.S. Pat. No. 6,049,018, a reaction mixture was prepared using aluminum hydroxide as the alumina source, colloidal silica as the silica source, and potassium hydroxide as the alkali source, and heated at 160° C. for 16 days using the static method. MSE zeolite obtained by heating and firing the product at 540° C. for 8 hours in the air was used as the seed crystals. The $SiO_2/Al_2O_3$ ratio was 24.0.

Examples 3-2 to 3-3 and Comparative Examples 3-1 to 3-3

Zeolites were synthesized in the same manner as in Example 3-1 except that gels and seed crystals having compositions shown in Tables 5 and 6 were used, and the reaction conditions described in the tables were used. The results are shown in Tables 5 and 6. Meanwhile, when a zeolite is synthesized from the gel alone, all of the gels used in the examples and comparative examples have a composition from which mordenite (MOR) is produced. The X-ray diffraction diagram of the product obtained in Example 3-3 is shown in FIG. 10A. As is evident from the drawing, the product was MSE zeolite including a small amount of beta zeolite (BEA).

Examples 3-4

An aqueous solution was obtained by dissolving 0.096 g of sodium aluminate, 2.08 g of 36% sodium hydroxide, and 0.67 g of an aqueous solution of 1 mol/L potassium hydroxide in 10.13 g of pure water. A mixture of 2.026 g of powder-form silica (Cab-O-Sil, M-5) and 0.203 g of the seed crystals used in Example 3-1 was added to the aqueous solution little by little, stirred, and mixed so as to obtain a gel having a composition described in Table 5. When a zeolite is synthesized from the gel alone, the gel has a composition from which mordenite (MOR) is produced. A mixture of the gel and a mixture of the seed crystals was fed into a 60 cc stainless steel sealed vessel, and statically heated at 140° C. for 57 hours under the autogenous pressure without being aged and stirred. After cooling of the sealed vessel, a product was filtered and washed using warm water, thereby obtaining white powder. As a result of an X-ray diffraction measurement, the product was MSE zeolite not including impurities.

Examples 3-5 to 3-8 and Comparative Examples 3-4 to 3-8

In the examples and comparative examples for which $K_2O/(Na_2O+K_2O)>0$, zeolites were synthesized in the same manner as in Example 3-4 except that appropriate concentrations of an aqueous solution of sodium hydroxide and an aqueous solution of potassium hydroxide were used as a Na ion source and a K ion source at a variety of mixing proportions, gels and seed crystals having compositions shown in Tables 5 and 6 were used, and the reaction conditions described in the tables were used. The results are shown in Tables 5 and 6. In addition, the X-ray diffraction diagrams of the products obtained in Examples 3-5 and 3-6 are shown in FIGS. 10B and 10C. Meanwhile, when a zeolite is synthesized from the gel alone, the gel used in the examples and comparative examples has a composition from which mordenite (MOR) is produced.

TABLE 5

| | Gel composition | | | | Seed crystals Addition | Reaction conditions | |
|---|---|---|---|---|---|---|---|
| Example | $SiO_2/Al_2O_3$ | $(Na_2O + K_2O)/SiO_2$ | $K_2O/(Na_2O + K_2O)$ | $H_2O/SiO_2$ | $SiO_2/Al_2O_3$ | amount*1 (wt %) | Temperature (° C.) | Time (h) |
| 3-1 | 100 | 0.300 | 0 | 20 | 24.0 | 10 | 160 | 29 |
| 3-2 | 100 | 0.300 | 0 | 20 | 24.0 | 10 | 150 | 42 |
| 3-3 | 100 | 0.300 | 0 | 20 | 24.0 | 10 | 140 | 60 |
| 3-4 | 100 | 0.300 | 0.0333 | 20 | 24.0 | 10 | 140 | 57 |
| 3-5 | 100 | 0.300 | 0.0667 | 20 | 24.0 | 10 | 140 | 64 |
| 3-6 | 100 | 0.300 | 0.1333 | 20 | 24.0 | 10 | 140 | 72 |
| 3-7 | 100 | 0.300 | 0.3333 | 20 | 24.0 | 10 | 140 | 96 |
| 3-8 | 100 | 0.300 | 0.5000 | 20 | 24.0 | 10 | 140 | 120 |

| | | Products | | | |
|---|---|---|---|---|---|
| Example | Zeolite | $SiO_2/Al_2O_3$ | $Na_2O/(Na_2O + K_2O)$ | $K_2O/(Na_2O + K_2O)$ | BET specific surface area ($m^2/g$) |
| 3-1 | MSE + small amount of MOR | — | — | — | — |
| 3-2 | MSE + small amount of MOR | — | — | — | — |
| 3-3 | MSE + small amount of BEA | 13.8 | 1.0 | 0 | 426 |
| 3-4 | MSE | 14.2 | — | — | — |
| 3-5 | MSE | 13.2 | 0.65 | 0.40 | 408 |
| 3-6 | MSE | 13.0 | 0.48 | 0.50 | 365 |
| 3-7 | MSE | — | — | — | — |
| 3-8 | MSE | — | — | — | — |

*1Amount of silica in the gel

TABLE 6

| | Gel composition | | | | Seed crystals Addition | Reaction conditions | | |
|---|---|---|---|---|---|---|---|---|
| Comparative Example | $SiO_2/Al_2O_3$ | $(Na_2O + K_2O)/SiO_2$ | $K_2O/(Na_2O + K_2O)$ | $H_2O/SiO_2$ | $SiO_2/Al_2O_3$ | amount*1 (wt %) | Temperature (° C.) | Time (h) | Products |
| 3-1 | 100 | 0.300 | 0 | 20 | — | 0 | 160 | 50 | Amorphous + small amount of MOR |
| 3-2 | 100 | 0.300 | 0 | 20 | — | 0 | 140 | 288 | MOR |
| 3-3 | 40 | 0.300 | 0 | 25 | — | 0 | 140 | 144 | Amorphous + MOR |
| 3-4 | 100 | 0.300 | 0.067 | 20 | — | 0 | 140 | 360 | MOR |
| 3-5 | 100 | 0.300 | 0.133 | 20 | — | 0 | 140 | 360 | MOR |

TABLE 6-continued

| Comparative Example | Gel composition | | | | Seed crystals | | Reaction conditions | | Products |
|---|---|---|---|---|---|---|---|---|---|
| | $SiO_2/Al_2O_3$ | $(Na_2O + K_2O)/SiO_2$ | $K_2O/(Na_2O + K_2O)$ | $H_2O/SiO_2$ | $SiO_2/Al_2O_3$ | Addition amount[*1] (wt %) | Temperature (° C.) | Time (h) | |
| 3-6 | 100 | 0.300 | 0.500 | 20 | — | 0 | 140 | 720 | MOR + unidentified substance |
| 3-7 | 100 | 0.300 | 0.750 | 20 | — | 0 | 140 | 720 | Unidentified substance |
| 3-8 | 100 | 0.300 | 0.957 | 20 | — | 0 | 140 | 720 | Unidentified substance |

[*1]Amount of silica in the gel

Example 4-1

(1) Preparation of a Seed Crystal

The following seed crystals were prepared. The X-ray diffraction diagram of the seed crystals is shown in FIG. 11.

The seed crystals are MTW zeolite obtained by carrying out static heating using a well-known method of the related art in which tetraethylammonium hydroxide was used as an organic structure-directing agent, sodium aluminate was used as the alumina source, and colloidal silica (LUDOX, HS-40) was used as the silica source. The conditions for the static heating are 160° C. and 120 hours. The $SiO_2/Al_2O_3$ ratio of the zeolite was 94.6. The zeolite was fired at 550° C. for 10 hours in the air, and used as seed crystals.

(2) Synthesis of Zeolites

An aqueous solution was obtained by dissolving 0.231 g of sodium aluminate and 2.027 g of 36% sodium hydroxide in 10.85 g of pure water. A mixture of 4.893 g of powder-form silica (Cab-O-Sil, M-5) and 0.489 g of the seed crystals was added to the aqueous solution little by little, stirred, and mixed so as to obtain a gel having a composition described in Table 7. When a zeolite is synthesized from the gel alone, the gel has a composition from which a plurality of compounds including MFI zeolite are produced. A mixture of the gel and a mixture of the seed crystals was fed into a 60 cc stainless steel sealed vessel, and statically heated at 165° C. for 4 days under the autogenous pressure without being aged and stirred. After cooling of the sealed vessel, a product was filtered and washed using warm water, thereby obtaining white powder. As a result of an X-ray diffraction of the product, it was confirmed that the product was MTW zeolite not including impurities.

Examples 4-2 to 4-11 and Comparative Examples 4-1 to 4-5

Zeolites were synthesized in the same manner as in Example 4-1 except that gels and seed crystals having compositions shown in Tables 7 and 8 were used, and the reaction conditions described in the tables were used. The results are shown in Tables 7 and 8. In addition, the X-ray diffraction diagrams of the products obtained in Examples 4-4 and 4-7 are shown in FIGS. 12A and 12B. Meanwhile, when a zeolite is synthesized from the gel alone, all of the gels used in the examples and comparative examples have a composition from which a plurality of compounds including MFI zeolite are produced. In addition, when a zeolite is synthesized from the gel, the gel used in Comparative example 4-5 has a composition from which mordenite is produced.

Examples 4-12 to 4-14

MTW zeolite obtained in Example 4-7 was used as the seed crystals. A gel having a composition shown in Table 7 was used. In addition, zeolites were synthesized in the same manner as in Example 4-1 except that the reaction conditions described in the same table were used. The results are shown in Table 7. In addition, the X-ray diffraction diagram of a product obtained in Example 4-14 is shown in FIG. 12C. Zeolites obtained in the examples are "green zeolites" obtained without essentially using an organic SDA. Meanwhile, when a zeolite is synthesized from the gel alone, all of the gels used in the examples have a composition from which a plurality of compounds including MFI zeolite are produced.

TABLE 7

| Example | Gel composition | | | Seed crystals | | Reaction conditions | | Products | |
|---|---|---|---|---|---|---|---|---|---|
| | $SiO_2/Al_2O_3$ | $Na_2O/SiO_2$ | $H_2O/SiO_2$ | $SiO_2/Al_2O_3$ | Addition amount[*1] (wt %) | Temperature (° C.) | Time (h) | Zeolite | $SiO_2/Al_2O_3$ |
| 4-1 | 120 | 0.125 | 8.3 | 94.6 | 10 | 165 | 96 | MTW + small amount of lamellar silicate | 66.0 |
| 4-2 | 120 | 0.175 | 11.7 | 94.6 | 10 | 165 | 96 | MTW + small amount of lamellar silicate | 53.4 |
| 4-3 | 100 | 0.100 | 10 | 94.6 | 10 | 165 | 72 | MTW + small amount of lamellar silicate | 46.8 |
| 4-4 | 100 | 0.150 | 10 | 94.6 | 10 | 165 | 65 | MTW + small amount of lamellar silicate | 51.4 |
| 4-5 | 100 | 0.200 | 13.2 | 94.6 | 10 | 165 | 65 | MTW | 36.6 |
| 4-6 | 80 | 0.125 | 8.25 | 94.6 | 10 | 165 | 72 | MTW + small amount of lamellar silicate | — |

TABLE 7-continued

| | Gel composition | | | Seed crystals Addition | Reaction conditions | | Products | |
|---|---|---|---|---|---|---|---|---|
| Example | $SiO_2/$ $Al_2O_3$ | $Na_2O/$ $SiO_2$ | $H_2O/$ $SiO_2$ | $SiO_2/$ $Al_2O_3$ | amount*[1] (wt %) | Temperature (° C.) | Time (h) | Zeolite | $SiO_2/$ $Al_2O_3$ |
| 4-7 | 80 | 0.175 | 11.5 | 94.6 | 10 | 165 | 36 | MTW | 32.4 |
| 4-8 | 60 | 0.150 | 10 | 94.6 | 10 | 165 | 55 | MTW | 29.0 |
| 4-9 | 60 | 0.200 | 13.3 | 94.6 | 10 | 165 | 36 | MTW | — |
| 4-10 | 40 | 0.150 | 10 | 94.6 | 10 | 165 | 72 | MTW + MOR | — |
| 4-11 | 20 | 0.100 | 6.5 | 94.6 | 10 | 165 | 120 | MTW + amorphous | — |
| 4-12 | 80 | 0.175 | 11.5 | 32.4*[2] | 10 | 165 | 24 | MTW + MFI | 28.8 |
| 4-13 | 100 | 0.200 | 13.2 | 32.4*[2] | 10 | 165 | 18 | MTW | 20.8 |
| 4-14 | 120 | 0.175 | 11.7 | 32.4*[2] | 10 | 165 | 16 | MTW | 29.2 |

*[1]Amount of silica in the gel
*[2]As the seed crystals, the product of Example 4-7 was used.

TABLE 8

| | Gel composition | | | Seed crystals Addition | Reaction conditions | | |
|---|---|---|---|---|---|---|---|
| Comparative Example | $SiO_2/$ $Al_2O_3$ | $Na_2O/$ $SiO_2$ | $H_2O/$ $SiO_2$ | $SiO_2/$ $Al_2O_3$ | amount*[1] (wt %) | Temperature (° C.) | Time (h) | Products |
| 4-1 | 100 | 0.150 | 10 | — | 0 | 165 | 144 | MFI + lamellar silicate + MOR |
| 4-2 | 80 | 0.175 | 11.5 | — | 0 | 165 | 336 | MFI + MOR |
| 4-3 | 60 | 0.200 | 13.3 | — | 0 | 165 | 168 | MFI + MOR |
| 4-4 | 60 | 0.150 | 10 | — | 0 | 165 | 168 | MFI + MOR |
| 4-5 | 20 | 0.150 | 10 | 94.6 | 10 | 165 | 72 | MOR |

*[1]Amount of silica in the gel

Example 5-1

Synthesis of BEA Zeolites (1) Preparation of Seed Crystals

The following seed crystals were prepared. The X-ray diffraction diagram of the seed crystals is shown in FIG. 13.

The seed crystals are BEA zeolite obtained by carrying out static heating using a well-known method of the related art in which tetraethylammonium hydroxide was used as an organic structure-directing agent, sodium aluminate was used as the alumina source, and powder-form silica (Mizukasil, P707) was used as the silica source. The conditions for the static heating are 165° C. and 96 hours. The $SiO_2/Al_2O_3$ ratio of the zeolite was 24.0. The zeolite was fired at 550° C. for 10 hours in the air, and used as seed crystals.

(2) Synthesis of Zeolites

An aqueous solution was obtained by dissolving 0.127 g of sodium aluminate and 2.562 g of 36% sodium hydroxide in 12.88 g of pure water. A mixture of 2.426 g of powder-form silica (Cab-O-Sil, M-5) and 0.243 g of the seed crystals was added to the aqueous solution little by little, stirred, and mixed so as to obtain a gel having a composition described in Table 9. When a zeolite is synthesized from the gel alone, the gel has a composition from which mordenite (MOR) is produced. A mixture of the gel and a mixture of the seed crystals was fed into a 60 cc stainless steel sealed vessel, and statically heated at 140° C. for 32 hours under the autogenous pressure without being aged and stirred. After cooling of the sealed vessel, a product was filtered and washed using warm water, thereby obtaining white powder. The X-ray diffraction diagram of the product is shown in FIG. 14A. As is evident from the drawing, the product was BEA zeolite not including impurities.

Examples 5-2 to 5-9 and Comparative Examples 5-1 to 5-3

Zeolites were synthesized in the same manner as in Example 5-1 except that gels and seed crystals having compositions shown in Tables 9 and 10 were used, and the reaction conditions described in the tables were used. The results are shown in Tables 9 and 10. In addition, the X-ray diffraction diagram of the product obtained in Example 5-3 is shown in FIG. 14B. Meanwhile, when a zeolite is synthesized from the gel alone, all of the gels used in the examples and comparative examples have a composition from which mordenite (MOR) is produced.

Example 5-10

A gel having the same composition as for the gel used in Example 5-9 was heated at 140° C. for 5 hours without adding the seed crystals. After completion of heating, the sealed vessel was cooled. After the temperature of the gel was lowered to room temperature, the lid of the sealed vessel was opened, the same seed crystals as in Example 5-9 were added at the same amount as in the same example, and the gel was uniformly stirred. After that, the lid was sealed, and the gel was again heated at 140° C. for 25 hours, thereby synthesizing a zeolite. Products were as shown in Table 9. As is evident from comparison between the present example and Example 5-9, the crystallization time was significantly shortened compared to Example 5-9.

TABLE 9

| Example | Gel composition SiO₂/Al₂O₃ | Gel composition Na₂O/SiO₂ | Gel composition H₂O/SiO₂ | Seed crystals SiO₂/Al₂O₃ | Seed crystals Addition amount*¹ (wt %) | Aging conditions Temperature (° C.) | Aging conditions Time (h) | Reaction conditions Temperature (° C.) | Reaction conditions Time (h) | Products Zeolite | Products SiO₂/Al₂O₃ | Products BET specific surface area (m²/g) |
|---|---|---|---|---|---|---|---|---|---|---|---|---|
| 5-1 | 90 | 0.300 | 20 | 24.0 | 10 | — | — | 140 | 32 | BEA | — | — |
| 5-2 | 60 | 0.325 | 25 | 24.0 | 10 | — | — | 140 | 30 | BEA | — | — |
| 5-3 | 34 | 0.225 | 20 | 24.0 | 10 | — | — | 150 | 48 | BEA | — | — |
| 5-4 | 30 | 0.193 | 20 | 24.0 | 10 | 80 | 24 | 150 | 120 | BEA | 13.0 | 473 |
| 5-5 | 20 | 0.225 | 25 | 24.0 | 10 | — | — | 150 | 67 | BEA | — | — |
| 5-6 | 18 | 0.200 | 15 | 24.0 | 10 | — | — | 150 | 60 | BEA | 9.4 | 534 |
| 5-7 | 16 | 0.200 | 15 | 24.0 | 10 | — | — | 150 | 60 | BEA | 8.8 | 374 |
| 5-8 | 14 | 0.195 | 15 | 24.0 | 10 | — | — | 150 | 65 | BEA + small amount of GIS | — | — |
| 5-9 | 40 | 0.325 | 25 | 24.0 | 10 | — | — | 140 | 38 | BEA | 10.4 | — |
| 5-10 | 40 | 0.325 | 25 | 24.0 | 10 | — | — | 140 | 25 | BEA | 10.4 | — |

*¹Amount of silica in the gel

TABLE 10

| Comparative Example | Gel composition SiO₂/Al₂O₃ | Gel composition Na₂O/SiO₂ | Gel composition H₂O/SiO₂ | Seed crystals SiO₂/Al₂O₃ | Seed crystals Addition amount*¹ (wt %) | Reaction conditions Temperature (° C.) | Reaction conditions Time (h) | Products Zeolite |
|---|---|---|---|---|---|---|---|---|
| 5-1 | 90 | 0.300 | 20 | — | 0 | 140 | 168 | MOR |
| 5-2 | 60 | 0.325 | 25 | — | 0 | 140 | 168 | MOR |
| 5-3 | 30 | 0.193 | 20 | — | 0 | 150 | 240 | MOR |

*¹Amount of silica in the gel

Example 6-1

Synthesis of BEA Zeolites
(1) Preparation of Seed Crystals
The same seed crystals as used in Example 5-1 were used.
(2) Synthesis of Zeolites
An aqueous solution was obtained by dissolving 0.477 g of sodium aluminate, 0.822 g of 36% sodium hydroxide, and 0.141 g of a lithium hydroxide additive in 14.54 g of pure water. A mixture of 2.017 g of powder-form silica (Cab-O-Sil, M-5) and 0.202 g of the seed crystals was added to the aqueous solution little by little, stirred, and mixed so as to obtain a gel having a composition described in Table 11. When a zeolite is synthesized from the gel alone, the gel has a composition from which mordenite (MOR) is produced. A mixture of the gel and a mixture of the seed crystals were fed into a 60 cc stainless steel sealed vessel, statically aged at 80° C. for 16 hours, and then statically heated at 150° C. for 72 hours under the autogenous pressure without being stirred. After cooling of the sealed vessel, a product was filtered and washed using warm water, thereby obtaining white powder. The X-ray diffraction diagram of the product is shown in FIG. 15A. As is evident from the drawing, the product was BEA zeolite not including impurities.

Examples 6-2 to 6-7 and Comparative Examples 6-1 to 6-4

Zeolites were synthesized in the same manner as in Example 6-1 except that gels and seed crystals having compositions shown in Tables 11 and 12 were used, and the reaction conditions described in the tables were used. The results are shown in Tables 11 and 12. In addition, the X-ray diffraction diagrams of the products obtained in Examples 6-3 and 6-6 are shown in FIGS. 15B and 15C. Meanwhile, when a zeolite is synthesized from the gel alone, all of the gels used in the examples have a composition from which mordenite (MOR) is produced. In addition, the ²⁷Al MAS NMR spectra of the products obtained in Examples 6-1 and 6-2 are shown in FIGS. 16A and 16B. The presence proportions (molar ratios) of tetracoordinate aluminum and six-coordinate aluminum, which were obtained from the spectra, are shown in Table 11.

TABLE 11

| Example | Gel composition SiO₂/Al₂O₃ | Gel composition Na₂O/SiO₂ | Gel composition Li₂O/SiO₂ | Gel composition H₂O/SiO₂ | Seed crystals SiO₂/Al₂O₃ | Seed crystals Addition amount*¹ (wt %) | Aging conditions Temperature (° C.) | Aging conditions Time (h) | Reaction conditions Temperature (° C.) | Reaction conditions Time (h) | Products Zeolite | Products SiO₂/Al₂O₃ | Products BET specific surface area (m²/g) | Products Coordination number and presence proportion of Al (%) |
|---|---|---|---|---|---|---|---|---|---|---|---|---|---|---|
| 6-1 | 20 | 0.175 | 0.050 | 25 | 24.0 | 10 | 80 | 16 | 170 | 72 | BEA | 8.8 | 518 | Tetracoordinate: 98 Six-coordinate: 2 |

TABLE 11-continued

| Example | Gel composition SiO₂/Al₂O₃ | Na₂O/SiO₂ | Li₂O/SiO₂ | H₂O/SiO₂ | Seed crystals Addition SiO₂/Al₂O₃ | amount*1 (wt %) | Aging conditions Temperature (° C.) | Time (h) | Reaction conditions Temperature (° C.) | Time (h) | Products Zeolite | SiO₂/Al₂O₃ | BET specific surface area (m²/g) | Coordination number and presence proportion of Al (%) |
|---|---|---|---|---|---|---|---|---|---|---|---|---|---|---|
| 6-2 | 18 | 0.165 | 0.050 | 25 | 24.0 | 10 | — | — | 150 | 72 | BEA | 7.0 | 548 | Tetracoordinate: 80 Six-coordinate: 20 |
| 6-3 | 16 | 0.160 | 0.050 | 15 | 24.0 | 10 | — | — | 150 | 46 | BEA | 6.8 | 472 | Tetracoordinate: 75 Six-coordinate: 25 |
| 6-4 | 14 | 0.155 | 0.050 | 15 | 24.0 | 10 | — | — | 150 | 44 | BEA | 5.8 | 537 | Tetracoordinate: 62 Six-coordinate: 38 |
| 6-5 | 14 | 0.155 | 0.035 | 15 | 24.0 | 10 | — | — | 150 | 45 | BEA | 6.4 | 410 | Tetracoordinate: 71 Six-coordinate: 29 |
| 6-6 | 12 | 0.155 | 0.050 | 15 | 24.0 | 10 | — | — | 150 | 42 | BEA | 5.2 | 485 | Tetracoordinate: 60 Six-coordinate: 40 |
| 6-7 | 16 | 0.165 | 0.020 | 15 | 24.0 | 10 | — | — | 150 | 62 | BEA | 9.0 | 529 | Tetracoordinate: 88 Six-coordinate: 12 |
| 6-8 | 16 | 0.170 | 0.010 | 15 | 24.0 | 10 | — | — | 150 | 68 | BEA | 9.4 | 481 | Tetracoordinate: 95 Six-coordinate: 5 |

*1Amount of silica in the gel

TABLE 12

| Comparative Example | Gel composition SiO₂/Al₂O₃ | Na₂O/SiO₂ | Li₂O/SiO₂ | H₂O/SiO₂ | Seed crystals Addition SiO₂/Al₂O₃ | amount*1 (wt %) | Reaction conditions Temperature (° C.) | Time (h) | Products Zeolite |
|---|---|---|---|---|---|---|---|---|---|
| 6-1 | 30 | 0.190 | 0.050 | 15 | — | 0 | 150 | 168 | MOR |
| 6-2 | 20 | 0.175 | 0.050 | 25 | — | 0 | 150 | 168 | MOR |
| 6-3 | 18 | 0.165 | 0.050 | 15 | — | 0 | 150 | 168 | MOR |
| 6-4 | 16 | 0.160 | 0.050 | 15 | — | 0 | 150 | 168 | MOR |
| 6-5 | 12 | 0.155 | 0.050 | 15 | — | 0 | 150 | 168 | MOR |

*1Amount of silica in the gel

Example 7-1

Dealumination of a Zeolite

An aqueous solution of 1 M citric acid (10 ml) and the beta zeolite obtained in Example 5-9 (0.2) were mixed so as to obtain a liquid mixture. The liquid mixture was fed into an autoclave, heated at 135° C. for 96 hours, and dealumination of the zeolite was carried out. After completion of heating, the zeolite was filtered, washed using water, and, then, fired at 550° C. for six hours in the atmospheric atmosphere. For the fired zeolite, the SiO₂/Al₂O₃ ratio and Na/Al ratio were chemically analyzed. An ICP-AES was used for the analysis. The results are shown in Table 13. In addition, the X-ray diffraction diagram of the obtained zeolite is shown in FIG. 17A.

Example 7-2

Dealumination of a zeolite was carried out in the same manner as in Example 7-1 except that the conditions shown in the following Table 13 were employed as the conditions of the dealumination. The same analysis as in Example 7-1 was carried out on the obtained zeolite. The results are shown in Table 13. In addition, the X-ray diffraction diagram of the obtained zeolite is shown in FIG. 17B.

Example 7-3

A mixed aqueous solution of 1 M citric acid and 1 M ammonium nitrate was used instead of the aqueous solution of 1 M citric acid. In addition, the conditions shown in the following table 13 were employed as the conditions of the dealumination. Dealumination of a zeolite was carried out in the same manner as in Example 7-1 except the above. The same analysis as in Example 7-1 was carried out on the obtained zeolite. The results are shown in Table 13. In addition, the X-ray diffraction diagram of the obtained zeolite is shown in FIG. 17C.

Examples 7-4 to 7-6

The MEL zeolite obtained in Example 2-2 (Example 7-4), the MSE zeolite obtained in Example 3-6 (Example 7-5), and the MTW zeolite obtained in Example 4-7 (Example 7-6) were used instead of the beta zeolite used in Example 7-1. In addition, the conditions shown in the following table 13 were employed as the conditions of the dealumination. Dealumination of a zeolite was carried out in the same manner as in Example 7-1 except the above. The same analysis as in Example 7-1 was carried out on the obtained zeolite. However, in Example 7-5, the K/Al ratio in addition to the Na/Al ratio was analyzed. The results are shown in Table 13. In addition, the X-ray diffraction diagrams of the obtained zeolites are shown in FIG. 18A to 18C.

TABLE 13

| Example | Zeolite Kind | Zeolite SiO$_2$/Al$_2$O$_3$ | Dealumination treatment Concentration of citric acid (M) | Concentration of ammonium nitrate (M) | Temperature (° C.) | Time (h) | After dealumination SiO$_2$/Al$_2$O$_3$ | Na/Al |
|---|---|---|---|---|---|---|---|---|
| 7-1 | BEA (Example 5-9) | 10.4 | 1.0 | 0.0 | 135 | 96 | 64.6 | 0.03 |
| 7-2 | BEA (Example 5-9) | 10.4 | 0.5 | 0.0 | 80 | 24 | 46.4 | 0.02 |
| 7-3 | BEA (Example 5-9) | 10.4 | 1.0 | 1.0 | 80 | 24 | 21.4 | 0.04 |
| 7-4 | MEL (Example 2-2) | 18.8 | 0.5 | 0.0 | 80 | 24 | 32.6 | 0.17 |
| 7-5 | MSE (Example 3-6) | 13.0 | 0.5 | 0.0 | 80 | 24 | 39.0 | 0.03 (Na/Al) 0.60 (K/Al) |
| 7-6 | MTW (Example 4-7) | 32.4 | 0.5 | 0.0 | 80 | 24 | 34.6 | 0.35 |

As is evident from the results shown in Table 13, it is found that the SiO$_2$/Al$_2$O$_3$ ratios of zeolites extremely increase due to dealumination using citric acid. In addition, it is found that the Na/Al ratios approximate to zero, and the zeolites are converted into H-type zeolite. Furthermore, it is found from the results of FIGS. 17 and 18 that the crystallinity of zeolites is maintained even when dealumination is carried out.

The invention claimed is:

1. A method of producing a zeolite comprising:
reacting a gel and zeolite seed crystals to produce a zeolite having the same kind of skeletal structure as the zeolite seed crystals;
wherein:
the gel comprises a silica source, an alumina source, an alkali source and water;
the gel is capable of synthesizing a zeolite without the use of the zeolite seed crystals, wherein the zeolite synthesized without the use of the zeolite seed crystals comprises one or more building units of zeolite;
the zeolite seed crystals comprise one or more composite building units of zeolite;
the zeolite seed crystals and the zeolite synthesized without the use of zeolite seed crystals comprise at least one equivalent composite building unit of zeolite;
wherein the reacting step occurs without the use of an organic structure-directing agent; and
wherein the zeolite produced is MEL zeolite, MSE zeolite, or MTW zeolite.

2. The method of producing a zeolite according to claim 1,
wherein the zeolite synthesized without the use of zeolite seed crystals has a different kind of skeletal structure as the zeolite seed crystals.

3. The method of producing a zeolite according to claim 2,
wherein the zeolite produced is MEL zeolite,
MEL zeolite is used as the zeolite seed crystals, and
the gel has a composition which forms a mordenite zeolite, when the zeolite is synthesized from the gel without the use of the zeolite seed crystals.

4. The method of producing a zeolite according to claim 3,
wherein a gel having a composition shown in the following (a) or (b) is used as the gel, SiO$_2$/Al$_2$O$_3$=40 to 200, Na$_2$O/SiO$_2$=0.24 to 0.4, H$_2$O/SiO$_2$=10 to 50, (a)

SiO$_2$/Al$_2$O$_3$=10 to 40,

Na$_2$O/SiO$_2$=0.05 to 0.25,

H$_2$O/SiO$_2$=5 to 50 (b).

5. The method of producing a zeolite according to claim 4,
wherein, as a post treatment, dealumination of the zeolite is carried out by mixing the zeolite and an aqueous solution of citric acid or a salt thereof, and heating a mixed aqueous solution under an autogenous pressure.

6. The method of producing a zeolite according to claim 3,
wherein, as a post treatment, dealumination of the zeolite is carried out by mixing the zeolite and an aqueous solution of citric acid or a salt thereof, and heating a mixed aqueous solution under an autogenous pressure.

7. The method of producing a zeolite according to claim 2,
wherein the zeolite produced is MSE zeolite,
MSE zeolite is used as the zeolite seed crystals, and
the gel has a composition which forms a mordenite zeolite, when the zeolite is synthesized from the gel without the use of the zeolite seed crystals.

8. The method of producing a zeolite according to claim 7,
wherein a gel having a composition shown in the following (a) or (b) is used as the gel, SiO$_2$/Al$_2$O$_3$=40 to 200, (Na$_2$O+K$_2$O)/SiO$_2$=0.24 to 0.4, K$_2$O/(Na$_2$O+K$_2$O)=0 to 0.7, H$_2$O/SiO$_2$=10 to 50, (a)

SiO$_2$/Al$_2$O$_3$=10 to 40, (Na$_2$O+K$_2$O)/SiO$_2$=0.05 to 0.25,

K$_2$O/(Na$_2$O+K$_2$O)=0 to 0.7,

H$_2$O/SiO$_2$=5 to 50 (b).

9. The method of producing a zeolite according to claim 7,
wherein, as a post treatment, dealumination of the zeolite is carried out by mixing the zeolite and an aqueous solution of citric acid or a salt thereof, and heating a mixed aqueous solution under an autogenous pressure.

10. The method of producing a zeolite according to claim 2,
wherein the zeolite produced is MTW zeolite,
MTW zeolite is used as the zeolite seed crystals, and
the gel has a composition which forms an MFI zeolite, when the zeolite is synthesized from the gel without the use of the zeolite seed crystals.

11. The method of producing a zeolite according to claim 10,
wherein a gel having a composition shown below is used as the gel, $SiO_2/Al_2O_3$=10 to 150, $Na_2O/SiO_2$=0.075 to 0.23, $H_2O/SiO_2$=5 to 50.

12. The method of producing a zeolite according to claim 2,
wherein, as a post treatment, dealumination of the zeolite is carried out by mixing the zeolite and an aqueous solution of citric acid or a salt thereof, and heating a mixed aqueous solution under an autogenous pressure.

13. The method of producing a zeolite according to claim 1,
wherein, as a post treatment, dealumination of the zeolite is carried out by mixing the zeolite and an aqueous solution of citric acid or a salt thereof, and heating a mixed aqueous solution under an autogenous pressure.

14. A method of producing a zeolite comprising:
reacting a gel and zeolite seed crystals to produce a zeolite having the same kind of skeletal structure as the zeolite seed crystals;
wherein:
the gel comprises a silica source, an alumina source, an alkali source and water;
the gel is capable of synthesizing a zeolite without the use of the zeolite seed crystals, wherein the zeolite synthesized without the use of the zeolite seed crystals comprises one or more building units of zeolite;
the zeolite seed crystals comprise one or more composite building units of zeolite;
the zeolite seed crystals and the zeolite synthesized without the use of zeolite seed crystals comprise at least one equivalent composite building unit of zeolite;
wherein the reacting step occurs without the use of an organic structure-directing agent;
wherein the zeolite produced is MFI zeolite; and
wherein a gel having a composition shown in the following (a) or (b) is used as the gel, $SiO_2/Al_2O_3$=40 to 200, $Na_2O/SiO_2$=0.24 to 0.4, $H_2O/SiO_2$=10 to 25, (a)

$SiO_2/Al_2O_3$=10 to 40, $Na_2O/SiO_2$=0.05 to 0.25, $H_2O/SiO_2$=5 to 25 (b).

15. The method of producing a zeolite according to claim 14,
wherein, as a post treatment, dealumination of the zeolite is carried out by mixing the zeolite and an aqueous solution of citric acid or a salt thereof, and heating a mixed aqueous solution under an autogenous pressure.

* * * * *

UNITED STATES PATENT AND TRADEMARK OFFICE
CERTIFICATE OF CORRECTION

PATENT NO. : 10,669,157 B2  
APPLICATION NO. : 15/492318  
DATED : June 2, 2020  
INVENTOR(S) : Keiji Itabashi et al.

Page 1 of 1

It is certified that error appears in the above-identified patent and that said Letters Patent is hereby corrected as shown below:

On the Title Page

Item (73) Assignee, insert -- The University of Tokyo, Tokyo (JP) --

Signed and Sealed this  
Eighteenth Day of May, 2021

Drew Hirshfeld  
*Performing the Functions and Duties of the  
Under Secretary of Commerce for Intellectual Property and  
Director of the United States Patent and Trademark Office*